United States Patent
Yan

(10) Patent No.: US 8,227,791 B2
(45) Date of Patent: Jul. 24, 2012

(54) STRAIN BALANCED LIGHT EMITTING DEVICES

(75) Inventor: Chunhui Yan, El Monte, CA (US)

(73) Assignee: Invenlux Limited, Central (HK)

( * ) Notice: Subject to any disclaimer, the term of this patent is extended or adjusted under 35 U.S.C. 154(b) by 229 days.

(21) Appl. No.: 12/693,408

(22) Filed: Jan. 25, 2010

(65) Prior Publication Data

US 2010/0187496 A1   Jul. 29, 2010

Related U.S. Application Data

(60) Provisional application No. 61/147,043, filed on Jan. 23, 2009.

(51) Int. Cl.
*H01L 29/06* (2006.01)

(52) U.S. Cl. .. 257/18; 257/13; 257/E21.09; 257/33.009; 438/47; 438/938

(58) Field of Classification Search .................... 257/13, 257/E21.09, E33.008, 15, 18; 438/47, 938
See application file for complete search history.

(56) References Cited

U.S. PATENT DOCUMENTS

| | | | |
|---|---|---|---|
| 6,859,474 B1 | 2/2005 | Johnson et al. | 372/43 |
| 6,943,381 B2 | 9/2005 | Gardner et al. | 257/103 |
| 7,345,324 B2 | 3/2008 | Bour et al. | 257/101 |
| 7,372,066 B2 | 5/2008 | Sato et al. | 257/14 |
| 7,514,707 B2 | 4/2009 | Sakai | 257/13 |
| 7,547,908 B2 | 6/2009 | Grillot et al. | 257/11 |
| 7,663,138 B2 * | 2/2010 | Fujikura | 257/9 |
| 2002/0144645 A1 | 10/2002 | Kim et al. | 117/90 |
| 2008/0153192 A1 | 6/2008 | Grillot et al. | 438/47 |
| 2008/0251890 A1 | 10/2008 | Park | 257/621 |
| 2009/0321781 A1 | 12/2009 | Broadley et al. | 257/103 |

FOREIGN PATENT DOCUMENTS

JP    2008-260682    10/2008

OTHER PUBLICATIONS

Notification of Transmittal of the International Search Report and the Written Opinion of the International Search Authority, or the Declaration (PCT/ISA/220, PCT/ISA/210 and PCT/ISA/237) of the International Application No. PCT/US2010/059558, dated Jun. 27, 2011.

(Continued)

*Primary Examiner* — Howard Weiss
*Assistant Examiner* — John C Ingham
(74) *Attorney, Agent, or Firm* — J.C. Patents

(57) ABSTRACT

A strain balanced active-region design is disclosed for optoelectronic devices such as light-emitting diodes (LEDs) and laser diodes (LDs) for better device performance. Lying below the active-region, a lattice-constant tailored strain-balancing layer provides lattice template for the active-region, enabling balanced strain within the active-region for the purposes of 1) growing thick, multiple-layer active-region with reduced defects, or 2) engineering polarization fields within the active-region for enhanced performance. The strain-balancing layer in general enlarges active-region design and growth windows. In some embodiments of the present invention, the strain-balancing layer is made of quaternary $In_xAl_yGa_{1-x-y}N$ ($0 \leq x \leq 1$, $0 \leq y \leq 1$, $x+y \leq 1$), whose lattice-constant is tailored to exert opposite strains in adjoining layers within the active-region. A relaxation-enhancement layer can be provided beneath the strain-balancing layer for enhancing the relaxation of the strain-balancing layer.

32 Claims, 22 Drawing Sheets

OTHER PUBLICATIONS

J.P. Sorbier et al., "Bi-dimensional ballistic model of a trap capture cross-section" Journal of Non-Crystalline Solids, vol. 322, No. 1-3, Jun. 2003, pp. 11-16.

Jianping Zhang et al., "Enhanced Luminescence in InGaN multiple quantum wells with quaternary AlInGaN barriers" Applied Physics Letters, vol. 77, No. 17, Oct. 23, 2000, pp. 2668-2670.

Edward T. Yu et al., "Spontaneous and piezoelectric polarization in Nitride heterostructures" Book chapter for inclusion in III-V Nitride Semiconductors: Applications and Devices, Taylor & Francis 2003, pp. 161-192.

Martin F. Schubert et al., "Polarization-matched GaInN/AlGaInN multi-quantum-well light-emitting diodes with reduced efficiency droop" Applied Physics Letters, vol. 93, No. 4, Jul. 28, 2008, pp. 0411102 (1-3).

* cited by examiner

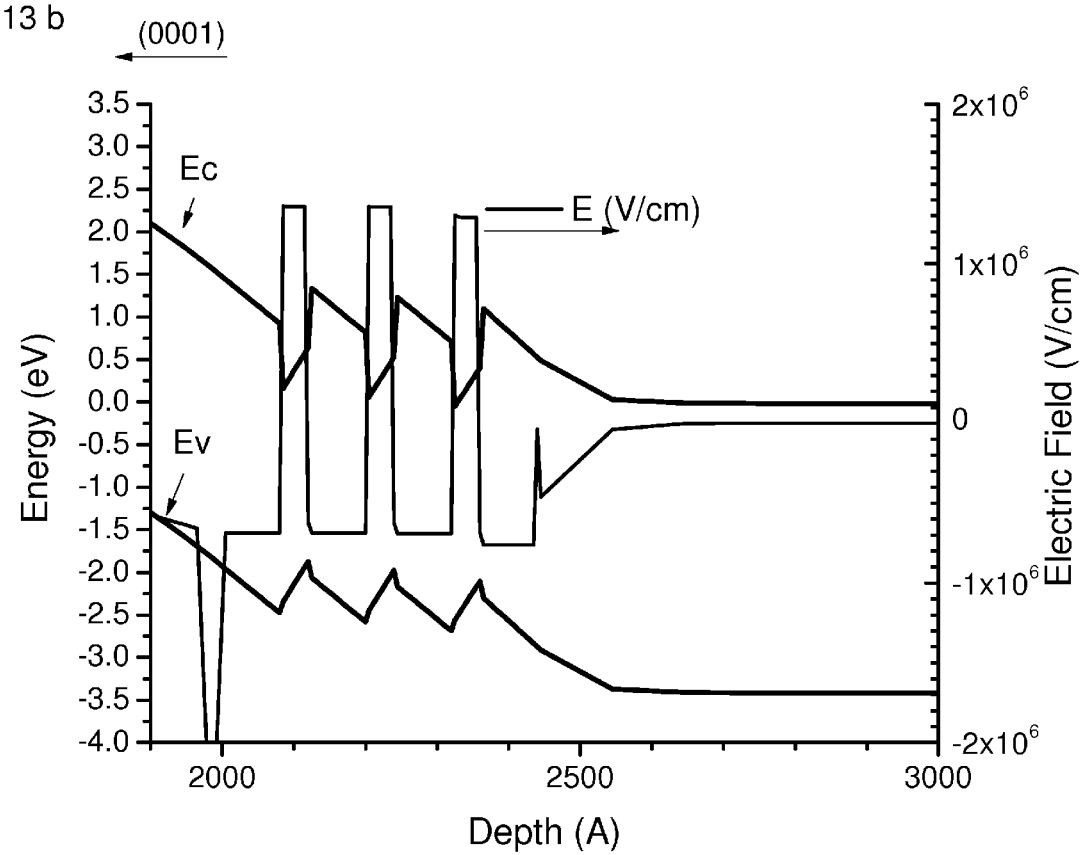

STRAIN BALANCED LIGHT EMITTING DEVICES

CROSS-REFERENCE TO RELATED APPLICATION

This application claims priority benefit of provisional application No. 61/147,043 filed on Jan. 23, 2009, the content of which is hereby incorporated by reference in its entirety.

FIELD OF INVENTION

The present invention relates generally to semiconductor light-emitting devices and more particularly to improving the active-region performances of the light-emitting devices.

BACKGROUND OF THE INVENTION

In a semiconductor light-emitting device, negative-charge carriers and positive charge carriers, or, technically termed as electrons and holes, are driven (injected) from opposite contacts to meet in the light-emitting region, the so-called active-region. A photon is emitted if an injected electron and an injected hole annihilate with each other in the active-region. This process is called radiative recombination process. The figure-of-merit for the radiative recombination is called internal quantum efficiency (IQE), which equals to the ratio of photons emitted over electron-hole pairs injected. Higher IQE means higher degree of energy savings provided that emitted photons can be properly extracted from the device.

In practice, however, not every injected electron and hole can recombine with each other. Defects (including impurities) in materials of which the active-region is made can often trap electrons or holes before they meet each other. Unwanted electric fields in the active-region can also separate electrons and holes, generating potential barriers preventing radiative recombination. These two facts are often the major roots for IQE reduction. Beside these, improper active-region designs can also lead to reduced IQE. For example, in a very thin active-region (designed so to avoid the large polarization-resulted built-in electric fields), injected carriers can quickly get overcrowded with increasing driving current. Overcrowded electrons (or holes) can scatter each other because of the repulsive force between them. This will reduce the electron-hole pairs' radiative recombination probability. When this happens, it is said Auger effect is taking place. So, Auger effect can be a factor resulting in IQE reduction in very thin active-regions, such as a very thin quantum well.

In nitride semiconductors, material defects and electric fields become more pronounced in terms of IQE reduction. Nitride semiconductors, including InN, GaN, AlN, and any ternary or quaternary of them, can emit light with wavelength from infrared to visible and deep UV range, being considered as the most promising material system for very high-efficiency solid-state lighting. To make a solid-state light-emitting device, such as an LED, different nitride layers need to be incorporated properly to form a structure. This means different nitride layers have to stack on top of other layers. Or, technically, different nitride layers are epitaxially grown on top of other layers. To maintain a good epitaxial growth, it is desired to have the least lattice-constant difference of adjoining layers the best. Lattice mismatch will bring in strain, which can generate defects, resulting in IQE reduction. Unfortunately, nitride semiconductors, especially In-containing nitrides, which are indispensable in realizing solid-state lighting, possess huge lattice mismatch with each other. For example, InN and GaN have a lattice mismatch in c plane above 11%, AlN and GaN mismatch over 3%. To give an example, lattice mismatch of 1% can result in defects (dislocations) of $\sim 10^9/cm^2$. These defects are deleterious when presenting in the device active-region.

C-plane nitrides also possess high-density surface charges, owing to self spontaneous polarization, and strain-induced piezoelectric polarizations. The charge density can be above $10^{13}/cm^2$, capable of introducing electric field more than 1 MV/cm.

As a result, the state-of-the-art nitride-based LEDs suffer from the abovementioned defects and inner electric fields. One manifestation is the increasing difficulty in making high-In-fraction, and high-Al-fraction LEDs for green and UV LEDs. High-In-fraction and high-Al-fraction means higher strain and higher inner electric fields within the structure. Another one is the LED efficiency droop. It is manifested that the efficiency declines with increasing current, after reaching peak efficiency under a relatively small current. The droop is preventing LEDs from high quantum efficiency under high current density, which is desirable for high power applications such as general lighting.

SUMMARY OF THE INVENTION

The present invention improves light emitting device performance in various aspects. In some of the embodiments, before the growth of device active-region, a relaxation-enhancement-layer (REL) and a strain-balancing layer (SBL) are deposited in sequence for preparation of the active-region growth. A REL is used to help SBL to reach its strain-free status in an accelerated way, facilitating SBL to provide lattice template for the active-region achieving balanced-strain status. The strain-balancing layer is made of $In_xAl_yGa_{1-x-y}N$ ($0 \leq x \leq 1$, $0 \leq y \leq 1$, $x+y \leq 1$), whose lattice-constant is tailored to exert opposite strains in adjoining layers within the active-region. When adjoining layers having alternative signs of strain, the active-region as a whole feels significantly reduced strain or even close to strain-free condition, enabling growth of high-quality and thick (if needed) active-region. The strain-balancing layer can be designed according to different active-region designs; vice versa, the active-region can also be formulated in line with the strain-balancing layer. The present invention greatly enhances the flexibility of proper device designs when strain is an issue.

The strain-balancing layer can also be used in some embodiments to engineer polarization fields within the active-region. The strain-balancing layer can control the magnitude and type of the interface sheet charge of adjoining layers within the active-region. In some embodiments, reduced interface sheet charge can increase electron-hole radiative recombination probability, thus increase devices' internal quantum efficiency. Also, reduced interface charge allows for thick active-region design, eliminating or significantly reducing Auger effect under high injection conditions.

Yet in some other embodiments, where electron-hole wavefunction overlapping in the active-region is not a major issue, the present invention claims that the polarization fields can be used to enhance device internal quantum efficiency. Huge polarization field (>1 MV/cm) can greatly screen defects' capture of injected carriers, reduce carrier loss, and increase internal quantum efficiency.

According to one aspect of the present invention, a light-emitting semiconductor device is provided. The light-emitting semiconductor device comprises a substrate; a first layer, such as III-nitride layers, formed on the substrate; an epitaxial III-nitride strain-balancing layer (SBL) with a lattice constant, $a_{sb}$, formed over the first layer; and a III-nitride active region formed over the strain-balancing layer. The III-nitride quantum well active region includes at least one well layer with a lattice constant, $a_w$, and a thickness, $t_w$, and at least two barrier layers with a lattice constant, $a_b$, and a thickness, $t_b$. The lattice constant of the strain-balancing layer is larger than that of the barrier layer and less than that of the well layer, and satisfies the following equation:

$$|t_w(a_{sb}-a_w)/a_w+t_b(a_{sb}-a_b)/a_b| \leq K,$$

where K can be 1 Å, or 0.6 Å, or 0.4 Å, or 0.2 Å.

Optionally, a relaxation-enhancement layer (REL) can be formed between the first layer and the strain-balancing layer. When the lattice constant of the strain-balancing layer is larger than that of the first layer, the lattice constant of the REL can be chosen to be either larger than that of the strain-balancing layer, or smaller than that of the first layer underneath the REL. When the lattice constant of the strain-balancing layer is smaller than that of the first layer, the lattice constant of the REL can be chosen to be either larger than that of the first layer underneath the REL, or smaller than that of the strain-balancing layer.

According to another aspect of the present invention, a light-emitting semiconductor device is provided. The light-emitting semiconductor device comprises a substrate; an electron injection layer formed over the substrate, a relaxation-enhancement layer formed over the electron injection layer; a strain-balancing layer formed over the relaxation-enhancement layer; and a III-nitride active region formed over the strain-balancing layer, wherein the III-nitride active region comprises at least one pair of a well layer and a barrier layer; wherein the lattice constant of the strain-balancing layer is larger than that of the barrier layer and smaller than that of the well layer. The lattice constant of the relaxation-enhancement layer is either larger than that of the strain-balancing layer, or smaller than that of the electron injection layer when the lattice constant of the strain-balancing layer is larger than that of the electron injection layer; or the lattice constant of the relaxation-enhancement layer is either smaller than that of the strain-balancing layer, or larger than that of the electron injection layer when the lattice constant of the strain-balancing layer is smaller than that of the electron injection layer.

According to still another aspect of the present invention, a method for designing a light-emitting semiconductor device is provided. The device having a III-nitride structure includes a strain relaxation-enhancement layer; a III-nitride strain-balancing layer with a lattice constant, $a_{sb}$; and a III-nitride quantum well active region formed over the strain-balancing layer, wherein the III-nitride quantum well active region includes at least one well layer with a lattice constant, $a_w$, and a thickness, $t_w$, and at least two barrier layer with a lattice constant, $a_b$, and a thickness, $t_b$; wherein the lattice constant of the strain-balancing layer is larger than that of the barrier layer and less than that of the well layer. The method comprises selecting $t_w$ and $t_b$ or selecting $a_{sb}$, $a_w$, or $a_b$ to satisfy the following equation:

$$|t_w(a_{sb}-a_w)/a_w+t_b(a_{sb}-a_b)/a_b| \leq K,$$

where K is a predetermined value.

BRIEF DESCRIPTION OF DRAWINGS

FIG. 13a shows a schematic cross-sectional structure of a multiple-quantum-well LED without a strain-balancing layer.

FIG. 13b shows the simulated band diagram and polarization field distribution of the multiple-quantum-well LED of FIG. 13a.

FIG. 14a shows a schematic cross-sectional structure of a multiple-quantum-well LED with a strain-balancing layer according to an embodiment of the present invention.

FIG. 14b shows the simulated band diagram and polarization field distribution of the multiple-quantum-well LED of FIG. 14a.

FIG. 16a shows a schematic cross-sectional structure of a multiple-quantum-well deep green LED without a strain-balancing layer.

FIG. 16b shows the band diagram and polarization field for the multiple-quantum-well deep green LED of FIG. 16a.

FIG. 17b shows the band diagram and polarization field for the multiple-quantum-well deep green LED of FIG. 17a.

DETAILED DESCRIPTION

Figure 1:
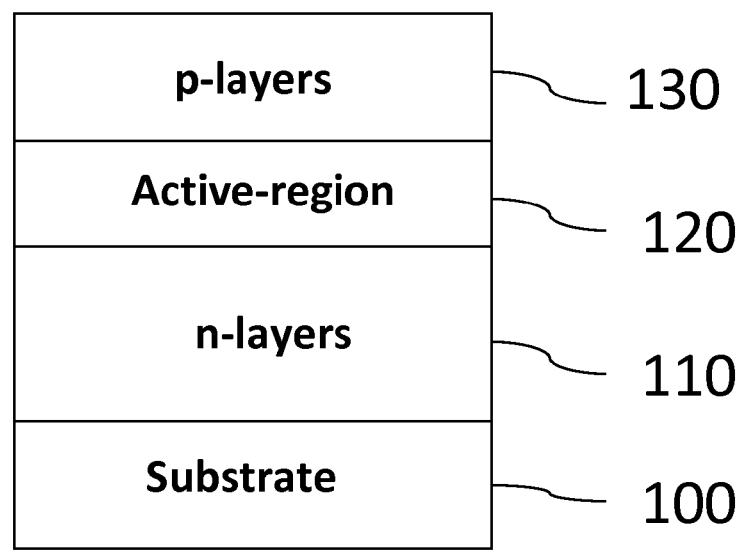
FIG. 1 shows a schematic cross-sectional structure of a prior art light-emitting device.

In the prior art light-emitting devices, the lattice-constant of the active-region is determined by the n-type base layers and there is no freedom to adjust the active-region lattice constant for a better performance. FIG. 1 shows a schematic cross-sectional structure of a prior art light-emitting device, consisting of a substrate 100, an electron-supplier n-type contact layer(s) 110, an active-region 120, and a hole-supplier p-type layer(s) 130.

Figure 2:
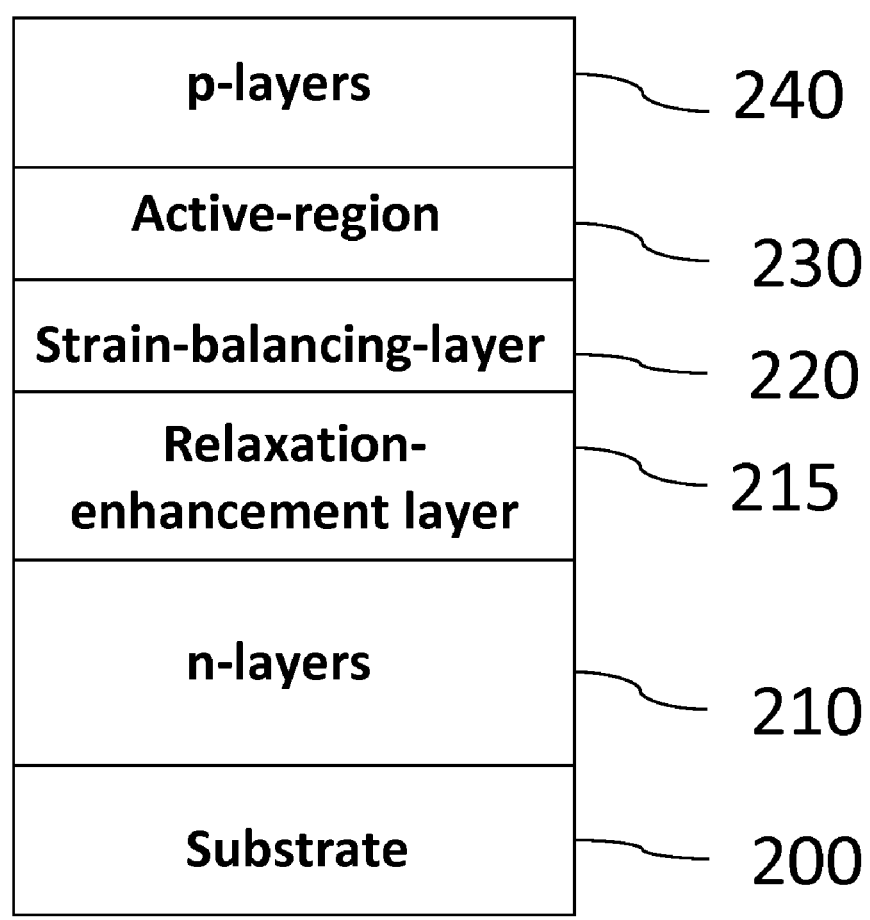
FIG. 2 shows a schematic cross-sectional structure of a light-emitting device according to an embodiment of the present invention.

The present invention proposes a strain-balancing layer under the active-region in a light-emitting device for improved device performance. In the embodiments for LEDs, as schematically shown in FIG. 2, the strain-balanced structure includes a substrate 200, an electron injection layer (n-layer) 210, a relaxation-enhancement-layer 215, a strain-balancing layer 220, an active region 230, and a hole-injection layer (p-layer) 240. The strain-balancing layer 220 serves as lattice template to realize a strain-balanced active-region.

The strain-balancing layer 220 can be made of III-nitride material with a composition of $In_xAl_yGa_{1-x-y}N$ ($0 \leq x \leq 1$, $0 \leq y \leq 1$, $x+y \leq 1$). In other words, the strain-balancing layer 220 can be made of a binary, ternary, or quaternary alloy of indium, aluminum, gallium, and nitrogen, depending on the intended usage and the desired structure of the active region 230.

For visible LEDs, the strain-balancing layer 220 is desirably made of $In_xGa_{1-x}N$. The indium content (indium molar fraction) of the strain-balancing layer 220 may vary between 1% and 60% (i.e., $0.01 \leq x \leq 0.6$), depending on the intended usage and the desired structure of the active region 230. For example, for blue LEDs, the strain-balancing layer 220 may contain as high as 20% to 30% of indium. For green LEDs, the strain-balancing layer 220 may contain as high as 25% to 40% of indium. For red LEDs, the strain-balancing layer 220 may contain as high as 35% to 50% of indium. For infrared LEDs, the strain-balancing layer 220 may contain as high as 35% to 60% of indium.

For UV LEDs, the strain-balancing layer 220 is desirably made of $Al_yGa_{1-y}N$. The aluminum content (Al molar fraction) of the strain-balancing layer 220 may vary between 5% and 60% (i.e., $0.05 \leq y \leq 0.6$).

Strain-balancing layer 220 can be a single layer or multiple layers, a uniform layer or a layer with varying composition and, thus, varying lattice constant as will be described later in more details. Strain-balancing layer 220 can be undoped or doped or codoped with Si, C, Zn, Mg or other elements. The strain-balancing layer 220 can be formed on the relaxation-enhancement-layer 215, or optionally directly formed on the electron injection layer 210 or on other layers above the electron injection layer 210 without using relaxation-enhancement-layer 215. In some embodiments of the present invention, strain-balancing layer 220 has a single crystal structure formed via epitaxial deposition. Strain-balancing layer 220 can be either electrical conductive or resistive.

The relaxation-enhancement-layer 215 can be made of $In_xAl_yGa_{1-x-y}N$ ($0 \leq x \leq 1$, $0 \leq y \leq 1$, $x+y \leq 1$), designed to enhance fast strain-relaxation of the strain-balancing layer within a reduced film thickness. In some embodiments of the present invention, the relaxation-enhancement-layer 215 is fully relaxed with the film thickness as thin as 500 nm or less, preferably as thin as 100 nm or less, more preferable as thin as 10 nm or less. Strain-balancing-layer structure 220 experiences stress from relaxation-enhancement-layer 215. However, since relaxation-enhancement-layer 215 is relaxed with a thin film thickness (could be thinner than strain-balancing-layer 220), the strain-energy between strain-balancing-layer 220 and relaxation-enhancement-layer 215 will be mostly distributed in relaxation-enhancement-layer 215. As a result the relaxation-enhancement layer 215 ensures a fast strain-relaxation for the strain-balancing-layer 220.

To enhance the fast strain-relaxation effect, when the lattice constant of strain-balancing-layer 220 is larger than that of the electron injection layer 210, the lattice constant of relaxation-enhancement-layer 215 is designed either larger than that of strain-balancing-layer 220 or smaller than that of the underlying electron injection layer 210.

To enhance the fast strain-relaxation effect, when the lattice constant of strain-balancing-layer 220 is less than that of the electron injection layer 210, the lattice constant of relaxation-enhancement-layer 215 is designed either less than that of the strain-balancing-layer 220 or larger than that of the electron injection layer 210.

Relaxation-enhancement-layer 215 can be a single layer or multiple layers, a uniform layer or a layer with varying composition and, thus, varying lattice constant. Relaxation-enhancement-layer 215 can be undoped or doped or codoped with, for example, Si, C, Zn, Mg or other elements to make further adjustment on lattice constant and electrical property for fine tuning the strain balance in active region 230. Relaxation-enhancement-layer 215 may also contain small amount of boron. In some embodiments of the present invention, relaxation-enhancement-layer 215 has a single crystal structure formed via epitaxial deposition, for example, by MOCVD, HYPE, or MBE, or their combination. Relaxation-enhancement-layer 215 can be either electrical conductive or resistive. Usually, relaxation-enhancement-layer 215 is grown to a thickness where it is fully relaxed. But in some embodiments, it is not necessary for relaxation-enhancement-layer 215 to be fully relaxed.

As shown in FIG. 2, relaxation-enhancement-layer 215 is formed on electron injection layer 210, such as high temperature GaN, AlN, InGaN, AlGaN, or AlInGaN layers, or formed on a conventional low temperature buffer layers, such as GaN, AlN layer or in general, AlInGaN layers.

In same embodiments of the present invention, relaxation-enhancement-layer 215 can be grown on electron injection layer 210 starting with GaN, AlN, InN, or other InGaAlN composition and varying the group-III elements gradually as the thickness increases to obtain a relaxation-enhancement-layer with varying composition and lattice constant until reaching the target composition, lattice constant, and thickness. The lattice constant of so obtained relaxation-enhancement-layer 215 can either be graded up or graded down. The initial lattice constant in the portion relaxation-enhancement-layer 215 nearest the underlying electron injection 210 can be designed either larger than that of the following strain-balancing-layer 220 or smaller than that of the underlying electron injection layer 210 when the lattice constant of the strain-balancing layer 220 is larger than that of the underlying electron injection layer 210; or either smaller than that of the following strain-balancing-layer 220 or larger than that of the underlying electron injection layer 210 when the lattice constant of the strain-balancing layer 220 is smaller than that of the underlying electron injection layer 210.

For a multiple layer structure of relaxation-enhancement-layer 215, the lattice constant of the layer nearest to the underlying electron injection layer 210 can be designed either larger than that of the following strain-balancing-layer 220 or smaller than that of the underlying electron injection layer 210 when the lattice constant of the strain-balancing layer 220 is larger than that of the underlying electron injection layer 210. When the lattice constant of the layer nearest to the underlying n-layer 210 in the relaxation-enhancement layer 215 is designed larger than that of the following strain-balancing-layer 220, the lattice constant of the layer nearest to the following strain-balancing-layer 220 in the relaxation-enhancement layer 215 can be smaller than the lattice constant of the layer nearest to the underlying electron injection layer 210 in the relaxation-enhancement layer 215. When the lattice constant of the layer nearest to the underlying electron injection layer 210 is designed smaller than that of the underlying electron injection layer 210, the lattice constant of the layer nearest to the following strain-balancing-layer 220 can be larger than the lattice constant of the layer nearest to the underlying electron injection layer 210. The lattice constants of other layers in relaxation-enhancement-layer 215 can be larger or smaller than or between that of the layer nearest to the following strain-balancing-layer 220 and that of the layer nearest to the underlying electron injection layer 210.

The term "electron injection layer" as used herein is intended that: the electron injection layer 210 can be any conventional doped or undoped layers, including doped or undoped n-type layers or p-type layers, as used in this field. Such conventional doped or undoped layers include, but not limited to, III-nitride layers which is substantially indium free, such as GaN layer, AlN layer, or AlGaN layers, other III-nitride layers containing indium. The electron injection layer 210 can be a single crystal layer or a non-single crystal layer, and can be one layer or multiple layers. The strain-balancing layer 220 can be epitaxially deposited directly on the n-layer layer 210 by MOCVD, HYPE, or MBE, or their combination without using relaxation-enhancement-layer 215. Optionally, additional layer(s), such as AlN or InN layer, can be formed on the electron injection layer 210 before the strain-balancing layer 220 is deposited. Optionally, an additional fully or partially relaxed layer, such as a III-nitride layer, having a lattice constant which is in between that of the electron injection layer 210 and that of the strain-balancing layer 220 can be formed between the electron injection layer 210 and the strain-balancing layer 220 with or without relaxation-enhancement-layer 215. Such additional layer(s) can be single crystal layer or non-single crystal layer.

The active region 230 can be formed directly on the strain-balancing layer 220. Optionally, additional layer(s) such as doped or undoped GaN, AlGaN, InGaN, or, in general, InAlGaN, silicon nitride or silicon oxide layers can be formed between the active region 230 and the strain-balancing layer 220. For example, inserting an AlGaN layer between the strain-balancing layer 220 and the active region 230 in a visible LED can broaden the energy band gap. The additional layer between the strain-balancing layer 220 and the active region 230 should be thin enough so that it is fully strained and, therefore, will not adversely affect the strain-balancing effect exerted on the active region 230 by the strain-balancing layer 220. In one embodiment, this additional layer can be an $Al_xGa_{1-x}N$ layer with an Al-molar fraction in the range of 5%-40% (i.e., $0.05 \leq x \leq 0.4$), and thickness equal to 300 nm or less, which is fully-strained with strain-relaxation degree being of 30% or less, or 25% or less. The active region 230 may include a single quantum well or multiple quantum wells (MQW). Typically, a quantum well layer is paired with corresponding barrier layer.

In FIGS. 3a and 3b, two embodiments with strain-balancing-layer and relaxation-enhancement-layer are depicted. Here the strain-balancing layer 320 is made of ternary $In_xGa_{1-x}N$. In FIG. 3a, the relaxation-enhancement-layer 315 is made of ternary $Al_yGa_{1-y}N$, which experiences large in-plane tensile strain from the n-GaN layers 310. Upon accelerated strain relaxation, relaxation-enhancement-layer 315 exerts an even larger in-plane compressive strain to the strain-balancing-layer 320, compared to the case without this relaxation-enhancement-layer 315, allowing strain-balancing-layer 320 to reach relaxation status within a thinner film thickness. To ensure an accelerated strain-relaxation process of relaxation-enhancement-layer 315, the aluminum composition molar fraction y is chosen to be in the range of 5-100% (i.e., $0.05 \leq y \leq 1$), preferably 10-50%, more preferably 15-30%.

In FIG. 3b, the relaxation-enhancement-layer 315' is chosen to be of ternary $In_yGa_{1-y}N$. In this embodiment, upon accelerated strain relaxation, the relaxation-enhancement-layer 315' exerts in-plane tensile strain to the strain-balancing-layer 320, allowing strain-balancing-layer 320 to reach relaxation status within a thinner thickness. It is noted that this in-plane tensile strain can benefit the following indium-containing layers' (SBL and MQW et al) growth, owing to its suppression of indium segregation for the InGaN growth. To ensure an accelerated strain-relaxation process of relaxation-enhancement-layer 315', the indium composition molar fraction y is chosen to be in the range of 10-100% (i.e., $0.1 \leq y \leq 1$), preferably 20-50%, more preferably 20-30%. The lattice constant of relaxation-enhancement-layer 315' is designed larger than that of strain-balancing-layer 320.

The present inventor has discovered that:
(a) If providing a strain-balancing layer, such as the strain-balancing layer 220, which generates opposite strains in a quantum well layer and its pairing barrier layer, the total strain experienced by the quantum well is reduced, and such opposite-strain compensation effect not only occurs in the pair of quantum well layer and barrier layer adjacent to the strain-balancing layer, but is also transferred to other pairs of quantum well layers and barrier layers further away from the strain-balancing layer. Therefore, the strain level (thus the defects) throughout the entire active region can be significantly reduced, which makes it possible to have thicker well layers, thinner barrier layer, and a larger number of pairs of quantum well layers and barrier layers with acceptable level of defects and structural stability. By providing a relaxation-enhancement-layer, such as relaxation-enhancement-layer 215, the strain-balancing effect can be further enhanced by enhancing fast strain-relaxation in the strain-balancing layer.
(b) The strain-energy built-up in the active region is related to both the strain and the thickness of the quantum well layer and the barrier layer, and can be used as guideline for designing the structure of an action region and a corresponding strain-balancing layer.
(c) A thick p-layer, such as p-InGaN layer, over an active region on the opposite side of a n-layer can enhance the performance of the strain-balancing layer, if the p-layer has a lattice constant closely matching with that of the strain-balancing layer. Closely matched lattice constants between the p-layer and the strain-balancing layer make it possible for the p-layer to exert as small as possible stress to the active-region and the strain-balancing layer. This p-layer will also play a role as a strain-absorbing zone for all the possible strains exerted by layers deposited thereupon.

Therefore, in some embodiments of the present invention, the lattice constant of the strain-balancing layer (SBL) (denoted as $a_{sb}$) is adjusted to be in-between of the lattice constants of the quantum-well layer (QW) (denoted as $a_w$) and quantum-barrier layer (QB) (denoted as $a_b$): $a_b < a_{sb} < a_w$.

Thus, the strain-balancing layer will exert opposite strains to the quantum-wells and barriers, i.e., a tensile strain in the barrier layers and a compressive strain in the quantum well layers. The total strain experienced by the quantum wells, redistributed now because of the strain-balancing layer, will thus be much less than without using a strain-balancing layer. With further appropriate thickness arrangement of the well layers and barrier layers (denoted as $t_w$ and $t_b$, respectively), the strain-energy built-up in the wells and barriers will compensate each other, resulting in an active-region with significantly reduced stress or even a stress-free active region as a whole. The proper thickness selection can be achieved in line with the following strain-energy compensation equation:

$$|t_w(a_{sb}-a_w)/a_w + t_b(a_{sb}-a_b)/a_b| \leq K$$

where K can be 1 Å, or 0.6 Å, or 0.4 Å, or 0.2 Å.

Because of the strain-compensation between well and barrier, thicker well layer can be applied in the active-region for less Auger effect, without suffering from high-density misfit defects caused by strain relaxation. Also, more periods of QW/QB can be grown to further enhance light generation efficiency.

Two embodiments are given in FIGS. 4a and 4b, for visible and UV LEDs, respectively. As shown in FIG. 4a, for visible LEDs, a strain-balancing layer 420 made of $In_xGa_{1-x}N$ is selected to exert opposite strain in quantum barrier layers 431 made of $In_yGa_{1-y}N$ and well layers 432 made of $In_zGa_{1-z}N$. In this embodiment, it is selected that $y \leq x \leq z$. In other words, the indium content of the well layer 432 is larger than that of the strain-balancing layer 420, while the indium content of the strain-balancing layer 420 is larger than that of the barrier layer 431. For visible LEDs, the indium content of the well layer 432 may vary between 5% and 50% (i.e., $0.05 \leq z \leq 0.5$), depending on the intended usage and the desired structure of the active region 430. For example, for blue LEDs, the well layer 432 may contain from 12% to 32% of indium. For green LEDs, the well layer 432 may contain from 24% to 45% of indium. The indium content of the barrier layer 431 may vary between 0% and 20% (i.e., $0 \leq y \leq 0.2$), depending on the intended usage and the desired structure of the active region 430. For example, for blue LEDs, the barrier layer 431 may contain from 0% to 10% of indium. For green LEDs, the barrier layer 431 may contain from 0% to 20% of indium. The indium content of the strain-balancing layer 420 may vary between 1% and 60% (i.e., $0.01 \leq x \leq 0.6$), depending on the intended usage and the desired structure of the active region 430. For example, for blue LEDs, the strain-balancing layer 420 may contain as high as 20% to 30% of indium. For green LEDs, the strain-balancing layer 420 may contain as high as 25% to 40% of indium. For red LEDs, the strain-balancing layer 420 may contain as high as 25% to 50% of indium. For infrared LEDs, the strain-balancing layer 420 may contain as high as 35% to 60% of indium.

The active region 430 may include one pair or multiple pairs of well layers 432 and quantum barrier 431. The number of pairs of well layers 432 and quantum barriers 431 can vary, for example, from 1 to 100. The thickness of different quantum barrier layers 431 can be the same or different and can be as thin as 5 Å, for example from 5 Å to 30 Å, or from 5 Å to 100 Å, or thicker. The thickness of wells 432 can be the same or different and in the range from 5 to 100 Å, or thicker. The compositions of quantum well layers 432 and quantum barriers 431 in one pair can be the same or different from that of other pairs. According to an embodiment, the ratio of thickness of quantum barrier layer 431 to the thickness of well layer 432, $t_b/t_w$, in one pair can be larger or smaller than, or equal to 1.

Substrate 400 can be of sapphire, silicon carbide, silicon, III-nitride, gallium arsenide, indium phosphide, germanium, or other suitable substrate, with any desired orientation. An electron-supplier n-type contact layer 410 is formed over substrate 400. There can be one or more n-type contact layers 410. The electron-supplier n-type contact layer 410 can be any layer conventionally used as an electron-supplier n-type layer in visible LEDs, such as GaN layer. The relaxation-enhancement layer 415 is formed over the electron-supplier n-type contact layer 410, and the strain-balance layer 420 is formed over the relaxation-enhancement layer 415. There can be one or more strain-balance layers 420.

As shown in FIG. 4b, for UV LEDs, a strain-balancing layer 420' made of $Al_xGa_{1-x}N$ is selected to exert opposite strain in quantum barrier layers 431' made of $Al_yGa_{1-y}N$ and well layers 432' made of $Al_zGa_{1-z}N$. The aluminum content of the well layer 432' may vary between 5% and 60% (i.e., $0.05 \leq z \leq 0.6$). The aluminum content of the barrier layer 431' may vary between 10% and 75% (i.e., $0.1 \leq y \leq 0.75$). The aluminum content of the strain-balancing layer 420' may vary between 5% and 60% (i.e., $0.05 \leq x \leq 0.6$).

The active region 430' may include one pair or multiple pairs of well layer 432' and quantum barrier 431'. The number of pairs of well layers 432' and quantum barriers 431' can vary, for example, from 1 to 100. The thickness of different quantum barrier layers 431' can be the same or different and as thin as 5 Å, for example from 5 Å to 30 Å, or from 5 Å to 100 Å, or thicker. The thickness of well layers 432' can be the same or different and in the range from 5 Å to 100 Å, or thicker. The compositions of well layers 432' and quantum barrier layers 431' in one pair can be the same or different from that in other pairs. According to an embodiment, the ratio of thickness of quantum barrier 431' to the thickness of well 432', $t_b/t_w$, in one pair can be larger or smaller than, or equal to 1.

Substrate 400' can be of sapphire, silicon carbide, silicon, III-nitride, gallium arsenide, indium phosphide, germanium, or other suitable substrate, with any desired orientation. An electron-supplier n-type contact layer 410' is formed over substrate 400'. There can be one or more n-type contact layers 410'. The electron-supplier n-type contact layer 410' can be any layers conventionally used as an electron-supplier n-type layer in UV LEDs, such as AlGaN layer. The relaxation-enhancement layer 415' is formed over the electron-supplier n-type contact layer 410', and the strain-balance layer 420' is formed over the electron-supplier n-type AlGaN contact layer 410'. There can be one or more strain-balance layers 420'.

Figure 5:
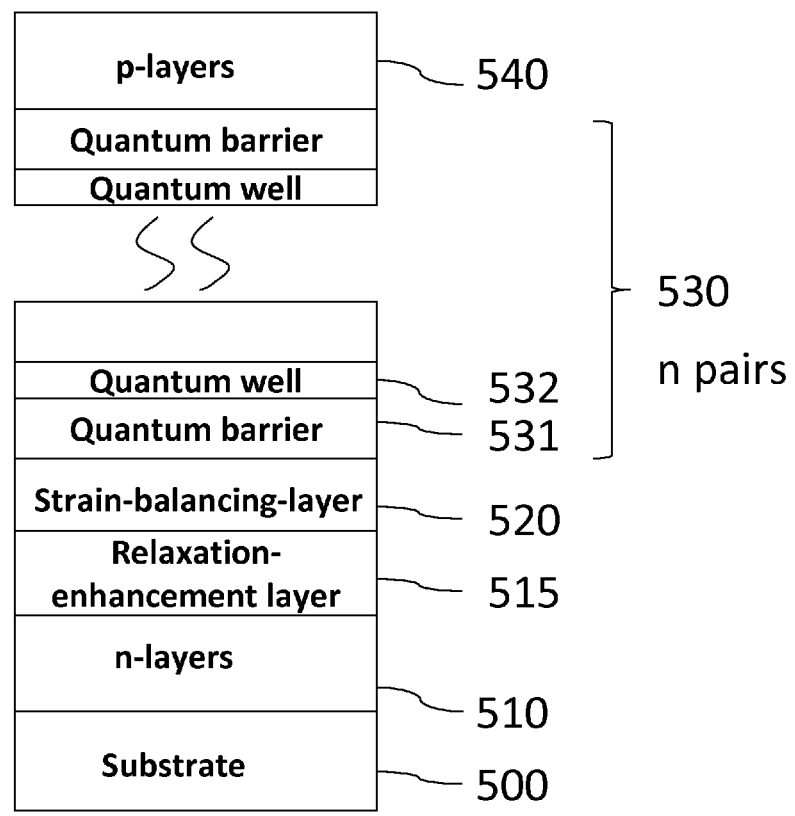
FIG. 5 shows a schematic cross-sectional view of a multiple-quantum-well LED structure according to an embodiment of the present invention.

FIG. 5 shows a schematic drawing of a GaN-based LED structure applying a strain-balancing layer according to an embodiment of the present invention. On top of a strain-balancing layer 520, an MQW active-region 530 can be grown with balanced strain for each pair of well layer 532 and barrier layer 531. In each pair of the well layer and the barrier layer, the lattice constant of barrier layer is always smaller than that of the corresponding well layer to ensure the carrier confinement, whereas the thickness of barrier layers can be larger, equal, or smaller than that of well layers. In a conventional blue LED structure, its barrier thickness is thicker than that of its well. The well layer (such as an InGaN layer) in the conventional LED has to be thin (due to large compressive strain) to avoid misfit defect generation. With the new strain-balanced MQW design, the well layer thickness can be much thicker than its conventional thickness (about 2 nm) or even thicker than that of the barrier layer if the lattice constant of the strain-balancing layer is designed to equal or close to, or even larger than, that of the well layer. This thicker well layer can greatly reduce Auger effect and thus enhance the carrier recombination inside the well region under high injection currents. In this strain-balanced structure, the thickness of the well layer can be as thick as 50 nm, which is at least a magnitude larger than the conventional one and this makes double hetero-structure (DH) plausible to be used as an active-region. Layer 510 can be any conventional n-layer as used in this field. Substrate 500 can be any conventional substrate as used in this field. Layer 540 can be any conventional p-layer as used in this field, including III-nitride layers. However, it is preferred that the p-layer has a lattice constant (denoted as $a_p$) close to that of the strain-balancing layer ($a_{sb}$), for example, $|(a_{sb}-a_p)/a_p| \leq 0.02$, preferably $\leq 0.005$. The layer 540 should be thick enough to achieve its in-plane bulk lattice constant, for example, thicker than 0.1 µm.

The structure shown in FIG. 5 can be manufactured as follows. Substrate 500, such as a sapphire wafer, on which a LED epitaxial structure is to be deposited, is first undergone a high temperature (1000-1100° C.) treatment in hydrogen or hydrogen/nitrogen mixture ambient for a period of time (e.g., 2-20 min.) to clean and repair any surface contaminants or damages. The temperature is then cooled down to 400-800° C. for buffer layer(s) (not shown) growth by simultaneously introducing $NH_3$ and metalorganic sources into the reactor. Thereafter, the buffer layer is heated up to 900-1050° C. in 5-10 min. for the following high-temperature nitride n-layer(s) 510 growth.

The high-temperature (grown under 1050-1120° C.) nitride layer(s) 510 may include an unintentionally doped GaN layer with a thickness of 0.2-1µ, a heavily Si-doped (by introducing silane into the reactor, with Si concentration of 2-10×10$^{18}$ cm$^{-3}$) GaN layer with a thickness of 2-3µ, and a lightly Si-doped GaN layer with a thickness of 0.1-0.5µ (by introducing silane into the reactor, with Si concentration of 1-30×10$^{17}$ cm$^{-3}$). For some structures, in order to improve LED reverse characteristics, one or more layers of Al-containing GaN (AlGaN) are also incorporated. The nitride n-layer(s) 510 can also be made of GaN layer(s), and/or AlGaN layer(s), and/or InGaN layer(s), or other suitable layer conventionally used in the art. Each of these layers can be a single crystal layer or a non-single crystal layer.

The relaxation-enhancement-layer 515 can be grown under the same temperature as layers 510, by add additional metalorganic aluminum source to achieve the desired aluminum composition, or can be grown at lower temperatures (600-700° C.) with the introduction of metalorganic indium source allowing more indium incorporation. Metalorganic indium, and/or gallium and/or aluminum sources, $NH_3$, and silane are introduced into the reactor for the growth of relaxation-enhancement-layer 515, such as an indium-containing layer with desired In molar fraction, or an aluminum-containing layer with desired Al molar fraction. Silane is used as dopant to control n-type conductivity for relaxation-enhancement-layer 515. As per disclosure abovementioned, Al-content and In-content relaxation-enhancement layers will accelerate the strain-relaxation process of the following strain-balancing-layer 520.

After the relaxation-enhancement-layer 515 growth, the reactor temperature is adjusted to some medium temperatures (750-850° C.) under nitrogen ambient for the growth of strain-balancing layer 520. Metalorganic indium, and/or gallium and/or aluminum sources, $NH_3$, and silane are introduced into the reactor for the growth of a III-nitride strain-balancing layer 520, such as an indium-containing layer with desired In molar fraction, or an aluminum-containing layer with desired Al molar fraction. Silane is used as dopant to control n-type conductivity for strain-balancing layer 520. In this embodiment, strain-balancing layer 520 is thicker than 0.1 µm to ensure achieving a strain-free bulk lattice constant. Preferably, its thickness is in the range of 0.1-1.0 µm, and more preferably in the range of 0.2-0.5 µm.

In some embodiments, strain-balancing layer 520 is ternary $In_xGa_{1-x}N$ alloy. Here the indium molar fraction x is selected to make sure that the in-plane lattice constant ($a_{sb}$) of strain-balancing layer 520 is larger than that ($a_b$) of quantum barrier layer 531, and not larger than that ($a_w$) of quantum well layer 532.

More specifically, adjusting indium molar fraction (x) will change the lattice constant of strain-balancing layer 520 and, thus, can be used to minimize the overall strain-energy within the active-region 530, which is represented by the following formula, $$K = t_w(a_{sb}-a_w)/a_w + t_b(a_{sb}-a_b)/a_b$$

Here, $t_w$, $t_b$ are respectively the quantum well and barrier thickness, $a_w$, $a_b$, $a_{sb}$ are the bulk in-plane lattice constants of quantum well layer 532, barrier layer 531, and strain-balancing layer 520, respectively.

Positive K value means the active-region 530 is under tensile strain, and negative means compressive strain. Value zero means that the active-region 530 suffers from minimized strain energy. When K=0, it is the most desired status for the active-region 530, where the multiple-quantum-well (MQW) active-region 530 can have maximized repeating stack numbers (periodicity) without introducing unacceptable defects.

According to an embodiment of the present invention, after the growth of strain-balancing layer 520, active-region MQW 530 is grown directly or indirectly on strain-balancing layer 520. The growth can be performed under the same temperature as that of strain-balancing layer 520, e.g., at a temperature of 750-850° C. under nitrogen ambient, or at a lower temperature of 650-750° C. Lower temperature growth is used for more indium incorporation for longer wavelength emitter such as green, red, and infrared LEDs. Using the present invention, barrier thickness in the MQW can be in the range of 50-300 Å, and quantum-well (QW) thickness in the range of 10-200 Å.

Upon active-region 530, p-layer(s) 540 is directly or indirectly deposited, which in some embodiments may include a Mg-doped AlGaN layer (Al-molar-fraction 0.1-0.25, 20-120 nm-thick), a Mg-doped InGaN layer, and a p-GaN layer.

It is the present invention that points out that a thick p-InGaN layer above the active-region can enhance the performance of strain-balancing layer 520. In an embodiment according to the present invention, a Mg-doped p-$In_pGa_{1-p}N$ layer can be grown at a temperature of 800-950° C., and have an In molar fraction of 2-30% (i.e., $0.02 \leq p \leq 0.3$) to have a close lattice constant match with strain-balancing layer 520. For a Mg-doped $In_pGa_{1-p}N$ layer having an In-molar-fraction of 2-30%, the bulk in-plane lattice constant is in the range of 3.196-3.296 A, while in a corresponding strain-balancing layer (e.g., $In_xGa_{1-x}N$, $0.01 \leq x \leq 0.4$) of an embodiment of the present invention, the bulk in-pane lattice constant can be adjusted in the range of 3.192-3.331 A. Indium-incorporation in this layer makes it possible for the p-layer to exert as small as possible (zero) stress to the MQW active-region and the strain-balancing layer. In an embodiment, this p-InGaN layer has a thickness of 0.1-0.6 µm. This p-InGaN layer will also play as a strain-absorbing zone for all the possible strains exerted by layers deposited upon it. This will make sure that the MQW active-region will not suffer from strains from the following epi-layers, or at least significantly reduce such strains.

After the Mg-doped p-$In_pGa_{1-p}N$ layer growth, a Mg-doped GaN with a thickness of 0.1-1.0µ is deposited at 850-950° C.

Because of its strain-compensation capability, the strain-balancing layer of the present invention opens up new design windows for LEDs made of piezoelectric materials or materials with large lattice-mismatch, such as III-nitrides and II-VI semiconductors.

In the case where the active-region is made of materials with large lattice-mismatch, the active-region thickness, and/or the MQW well/barrier pairing numbers are seriously limited by the mismatch. For example, in the prior art, blue/green LEDs made of GaN/InGaN MQW active-region will possess a residual strain-energy (according to the abovementioned K formula) of approximately −0.65/−0.86 Å per pair QW, respectively for blue and green LEDs. This means the MQW period has to be limited to be below 200 Å, and periodicity to be less than 10 pairs. Increasing the MQW period and periodicity will simply degrade the LED performance in the prior art. However, according to embodiments of the present invention with a proper strain-balancing layer, the MQW well/barrier pairs can be increased to larger than 10. This will benefit the LED's high-power performance. With the present invention, the MQW periodicity can be in the range of 10-100 well/barrier pairs with acceptable performance. In some embodiments, the MQW may contain 10-40 well/barrier pairs. In some other embodiments, the MQW may contain 12-20 well/barrier pairs.

Figure 6:
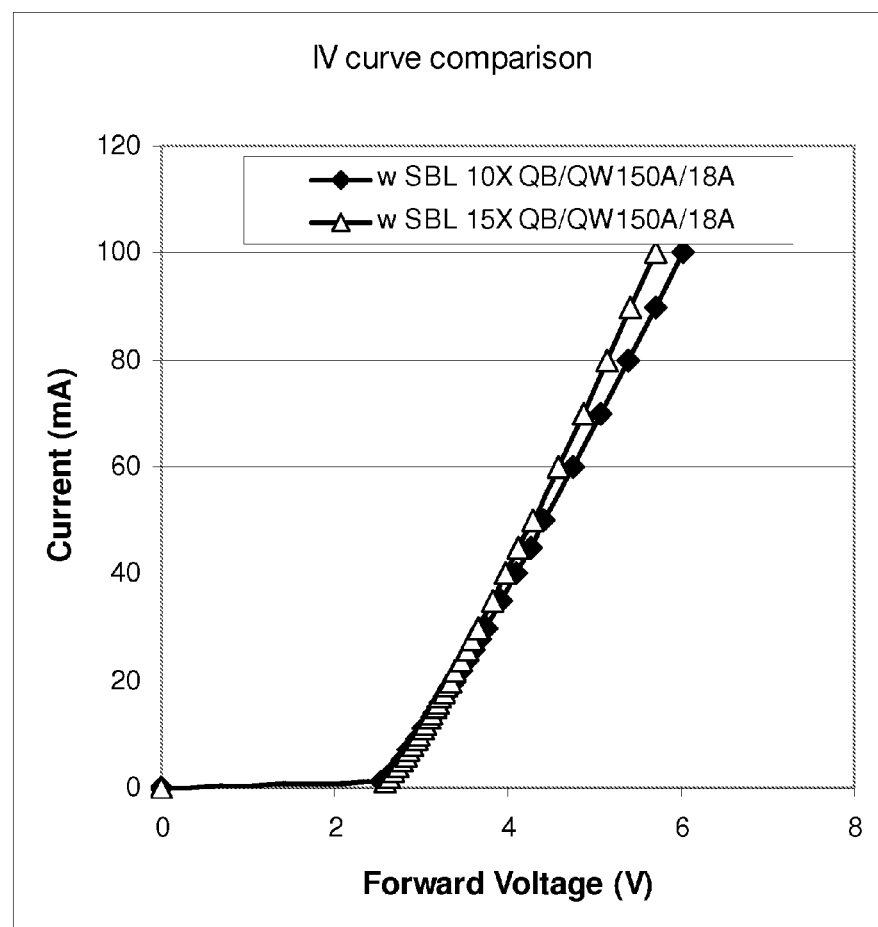
FIG. 6 shows current-voltage (IV) curves of two embodiments with a multiple-quantum-well structure having 10 and 15 well/barrier pairs, respectively, according to the present invention.

In FIG. 6, it is shown that after increasing MQW pair number, from 10 to 15 pairs, the LED electric characteristics are not degraded, as should be expected from the prior art. On the contrary, the electric characteristics are improved. Shown in FIG. 6 are current-voltage (IV) curves of two embodiments with 10 (IV data presented by solid diamond symbols) and 15 (IV data presented by open triangle symbols) pairs of MQW according to the present invention. (Note that these curves were not recorded from isolated chips but rather from chips on-wafer with simplified device processing steps.) A steeper current-voltage curve means reduced series resistance of the LED and thus improved IV characteristics. The two embodiments shown in FIG. 6 have the structure schematically shown in FIG. 5. Specifically, the n-layer 510 includes a 0.1-2 μm-thick undoped GaN layer, a 0.5-3 μm-thick heavily doped n-GaN ($1\text{-}20\times10^{18}$ cm$^{-3}$), and a 0.01-1 μm-thick lightly Si-doped GaN layer ($0.1\text{-}15\times10^{17}$ cm$^{-3}$) in sequence with the undoped GaN layer being directly formed on the substrate 500. The relaxation-enhancement-layer 515 is a 0.02-0.5 μm-thick n-Al$_x$Ga$_{1-x}$N ($0.1\times0.4$) layer. The strain-balancing-layer 520 is a 0.02-0.5 μm-thick In$_x$Ga$_{1-x}$N ($0.02 \leq x \leq 0.15$) layer. The MQW active-region 530 is GaN/In$_{0.35}$Ga$_{0.65}$N MQW (periodicity 10 and 15 respectively), where barrier/well thickness being 150/18 Å, respectively. P-layer(s) 540 includes a Mg-doped Al$_x$Ga$_{1-x}$N layer ($0.05\times0.35$), a Mg-doped In$_x$Ga$_{1-x}$N layer ($0.03 \leq x \leq 0.15$), and a ~200-nm p-GaN layer in sequence with the Mg-doped AlGaN layer being directly formed on the active region 530.

Figure 7:
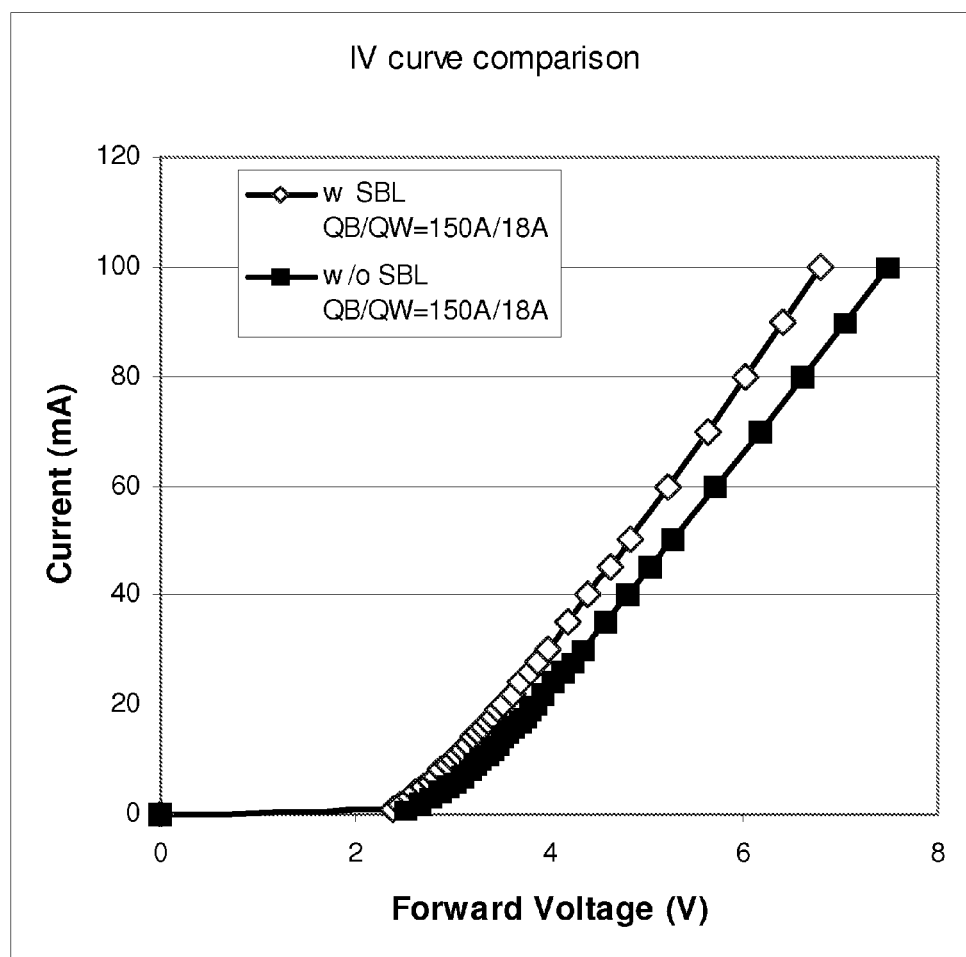
FIG. 7 shows the current-voltage curves of two LED structures, one without a strain-balancing layer, and the other with a strain-balancing layer according to an embodiment of the present invention.
Figure 8:
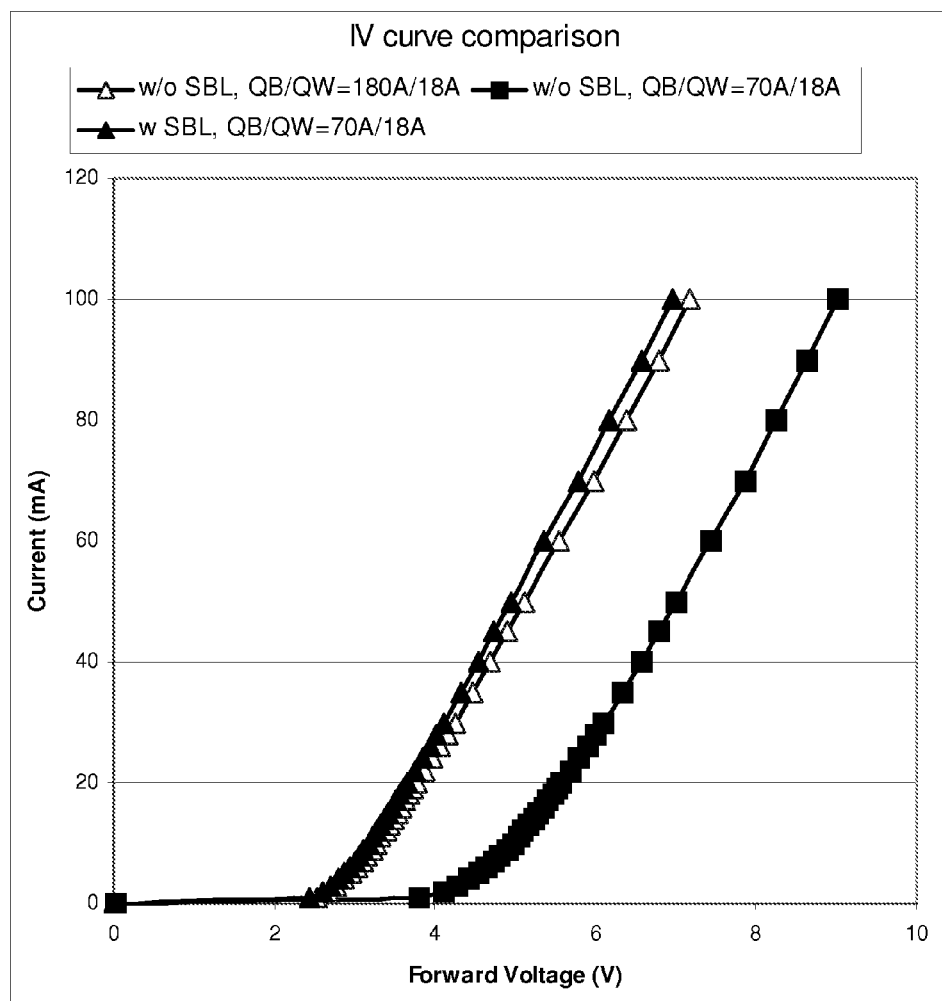
FIG. 8 shows current-voltage (IV) curves of two LED structures without a strain-balancing layer and one LED structure with a strain-balancing layer according to an embodiment of the present invention, illustrating the effect of barrier layer thickness on the current-voltage characteristics of LED.

In the prior art, LEDs made of piezoelectric materials or materials with large lattice-mismatch, such as III-nitrides and II-VI semiconductors, the device turn-on voltages and series resistance severely depend on the MQW barrier/well thickness and composition. For example, in the prior art, if the quantum barrier is thinner than 140 Å, the device turn-on voltage and series resistance will increase, resulting in a degraded the electric characteristics. One of the benefits of applying strain-balancing-layer to LEDs is the improved current-voltage (IV) characteristics. This was demonstrated by the IV curve comparison of LEDs with or without SBL, SBL insertion being the only change in the compared LED structures. As seen from FIG. 7, for GaN/InGaN MQW LEDs, with the barrier/well thickness configuration of 150 Å/18 Å, noticeable differences in turn-on voltages and series resistances were already observed for the structures with and without SBL, and with SBL the IV characteristics were clearly improved. The difference in turn-on voltages can be manifested in greater clarity for GaN/InGaN MQW LEDs with thinner barriers, as shown in FIG. 8. As seen, for an LED without strain-balancing layer according to the prior art, for a well layer (QW) of a thickness of 18 Å, when quantum barrier (QB) thickness being reduced from 180 Å (See data represented by open triangle symbols in FIG. 8) to 70 Å (See data represented by solid square symbols in FIG. 8), the device turn-on voltage increased approximately 1.6 volts from 2.4V to 4 V. After applying the present invention, by inserting a strain-balancing layer in a similar structure, even for a thinner barrier (70 Å), the device IV characteristics are not degraded (See data represented by solid triangle symbols in FIG. 8). This means that the conventional GaN/InGaN LED structures have to maintain a barrier/well thickness ratio greater than 8 to possess acceptable IV characteristics. The present invention allows for barrier/well thickness ratio less than 8, or less than 4. Our further experiment showed that the ratio could be even less than 1 without degrading the IV characteristics.

Figure 9:
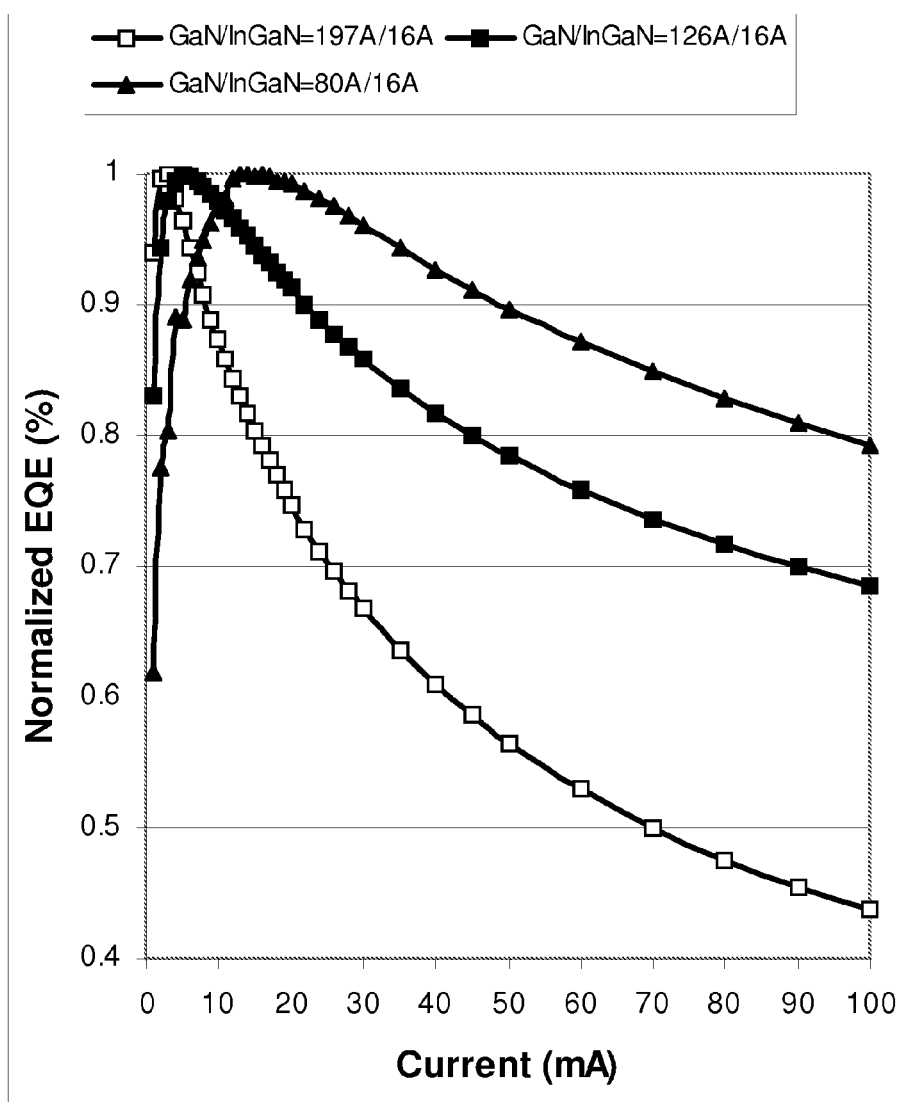
FIG. 9 compares the external quantum efficiency of LEDs applied with the present invention with different barrier thickness.

One direct benefit of thinner barrier MQW design, allowed by the present invention, is the reduced efficiency droop for LEDs under high-density-injection currents. This fact is illustrated in FIG. 9, where GaN/InGaN MQW LEDs applied with SBL with different quantum barrier thickness (being the only variable) were compared in turns of external quantum efficiency (EQE) under increasing injection currents. As seen, the peak EQE values shifted to higher injection currents with decreasing the quantum barrier thickness from 197 Å (See data represented by open square symbols in FIG. 9) to 80 Å (See data represented by solid triangle symbols in FIG. 9). Also, the EQE droop with increasing injection currents was mitigated with thinner barriers.

Table 1 gives some examples of multiple quantum well (MQW) structures with large number of well/barrier pairs (n) and small barrier/well thickness ratio (R) (in other words, thinner barrier layer and/or thicker well layer), and also lists well layer thickness ($t_w$), indium molar fraction (x) and aluminum molar fraction (y) of well layer which is made of In$_x$Al$_y$Ga$_{1-x-y}$N. The composition of the corresponding barrier layer is similar to that discussed previously in connection with FIGS. 4a and 4b. For visible LED using In$_y$Ga$_{1-y}$N barrier layer, the indium molar fraction of the barrier layer is between 0% and 20% (i.e., $0 \leq y \leq 0.2$). For UV LED using Al$_y$Ga$_{1-y}$N barrier layer, the aluminum molar fraction of the barrier layer is between 10% and 75% (i.e., $0.1 \leq y \leq 0.75$).

TABLE 1

| | QB/QW ratio, R | well/barrier pair, n | $t_w$ (Å) | In molar fraction, x | Al molar fraction, y | Vf @ 20 A/cm$^2$ |
|---|---|---|---|---|---|---|
| Deep UV | $0.3 \leq R \leq 6$ | $15 \leq n \leq 100$ | $5 \leq t_w \leq 200$ | $0 \leq x \leq 5\%$ | $0 \leq y \leq 60\%$ | Vf < 6.5 |
| Near UV | $0.3 \leq R \leq 6$ | $15 \leq n \leq 100$ | $5 \leq t_w \leq 200$ | $0 \leq x \leq 15\%$ | $0 \leq y \leq 10\%$ | Vf < 4 |
| Blue | $0.3 \leq R \leq 6$ | $12 \leq n \leq 80$ | $5 \leq t_w \leq 200$ | $10\% \leq x \leq 30\%$ | y = 0 | Vf < 3.4 |
| Green | $0.3 \leq R \leq 8$ | $10 \leq n \leq 60$ | $5 \leq t_w \leq 200$ | $20\% \leq x \leq 40\%$ | y = 0 | Vf < 3.2 |
| Yellow | $0.3 \leq R \leq 10$ | $8 \leq n \leq 40$ | $5 \leq t_w \leq 200$ | $30\% \leq x \leq 46\%$ | y = 0 | Vf < 3 |
| Red | $0.3 \leq R \leq 10$ | $8 \leq n \leq 40$ | $5 \leq t_w \leq 200$ | $35\% \leq x \leq 60\%$ | y = 0 | Vf < 3 |

When the above listed multiple quantum well (MQW) structures are built on the strain-balancing layer and, optionally, on the relaxation-enhancement layer according to the present invention, satisfactory performance can be achieved even with large number of well/barrier pairs (n) and small barrier/well thickness ratio (R). One requirement for satisfactory performance of a light emitting device is a reasonably low forward voltage at a given current density. Table 1 lists the forward voltage at a current density of 20 A/cm$^2$, Vf, that is achievable in the visible and UV LEDs having the listed MQW structures with the strain-balancing layer and optional relaxation-enhancement layer according to the present invention. For example, in a blue LED having a MQW structure formed on a strain-balancing layer and a relaxation-enhancement layer according to the present invention, wherein the MQW structure contains 12-80 well/barrier pairs with barrier/well thickness ratio being between 0.3 and 6, each well layer having a thickness between 5-200 Å, a forward voltage, Vf, no more than 3.4v can be achieved. Generally speaking, the well layer is preferred to have a thickness between 10-40 Å.

Figure 3:
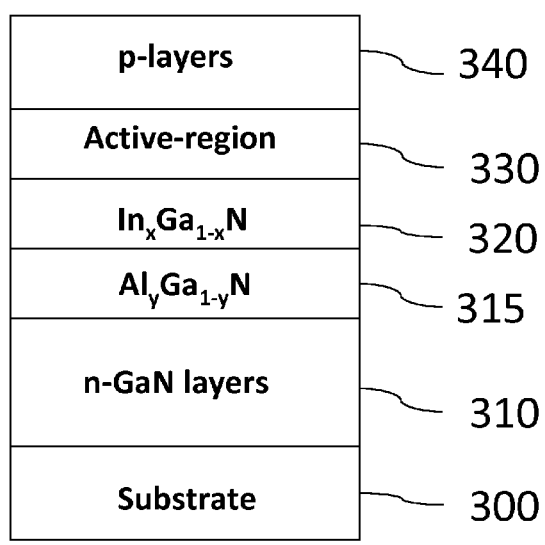
FIG. 3a shows a schematic cross-sectional structure of a light emitting device according to an embodiment of the present invention, with a compressive-strain relaxation-enhancement-layer.
FIG. 3b shows a schematic cross-sectional structure of a light emitting device according to an embodiment of the present invention, with a tensile-strain relaxation-enhancement-layer.
Figure 3:
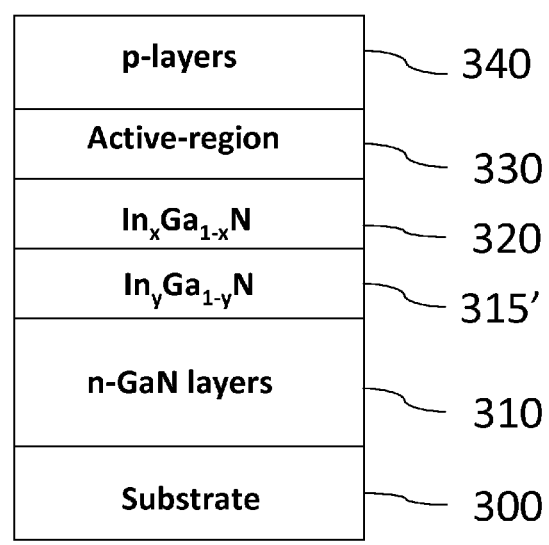

The strain-balancing layer and the relaxation-enhancement layer used here are similar to those described in connection with FIGS. 2, 3a, and 3b. The strain-balancing layer is made of $In_xAl_yGa_{1-x-y}N$. For visible LEDs, the indium content (indium molar fraction) of the strain-balancing layer is in the range between 1% and 40% (i.e., $0.01 \leq x \leq 0.4$). For example, for blue LEDs, the strain-balancing layer may contain as high as 20% to 30% of indium. For green LEDs, the strain-balancing layer may contain as high as 25% to 40% of indium. The aluminum content (aluminum molar fraction) of the strain-balancing layer may vary between 0% and 5% (i.e., $0 \leq y \leq 0.05$), preferably aluminum molar fraction is 0. For UV LEDs, the aluminum content (Al molar fraction) of the strain-balancing layer may vary between 5% and 60% (i.e., $0.05 \leq y \leq 0.6$), the indium content (In molar fraction) of the strain-balancing layer may vary between 0% and 15% (i.e., $0 \leq x \leq 0.15$), preferably indium molar fraction is 0. In the above embodiments, the MQW structures listed in Table 1 can be configured in a LED structure as shown in FIGS. 2, 3a, and 3b using similar substrate, n-layer, and p-layer as described in connection with FIGS. 2, 3a, and 3.

In general, for UV, blue, green, red, or infrared LEDs, $In_{xsb}Al_{ysb}Ga_{1-xsb-ysb}N$ layers can be used as the strain-balancing layer. The quantum well and barrier layers can also be constructed by $In_{xw}Al_{yw}Ga_{1-xw-yw}N$ and $In_{xb}Al_{yb}Ga_{1-xb-yb}N$, respectively. Here $x_{sb}$, $y_{sb}$, $x_b$, $y_b$, $x_w$, and $y_b$ are defined in the range of 0 and 1, including 0 and 1. For green or even longer wavelength LEDs, more indium will be incorporated into the strain-balancing layer, and so does for the quantum-well layer. But for UV LEDs, more aluminum will be needed in the strain-balancing layer.

The thickness of the strain-balancing layer can be in the range of ten angstroms to a few hundreds of microns depending on the indium or aluminum composition. According to an embodiment of the present invention, the strain-balancing layer is fully relaxed with low-defect-density for the following layers' growth. The composition of the strain-balancing layer can be calculated according to the active-region design. Once the composition being determined, the layer's thickness is chosen to be thick enough, allowing it to adopt its natural bulk lattice constants.

In some embodiments, the strain-balancing layer does not necessarily have to be fully relaxed, i.e., not necessary to obtain its natural bulk lattice constants. In these embodiments, the composition of the strain-balancing layer has to be calculated according to the active-region design and the strain-relaxation degree of the strain-balancing layer itself.

Figure 10:
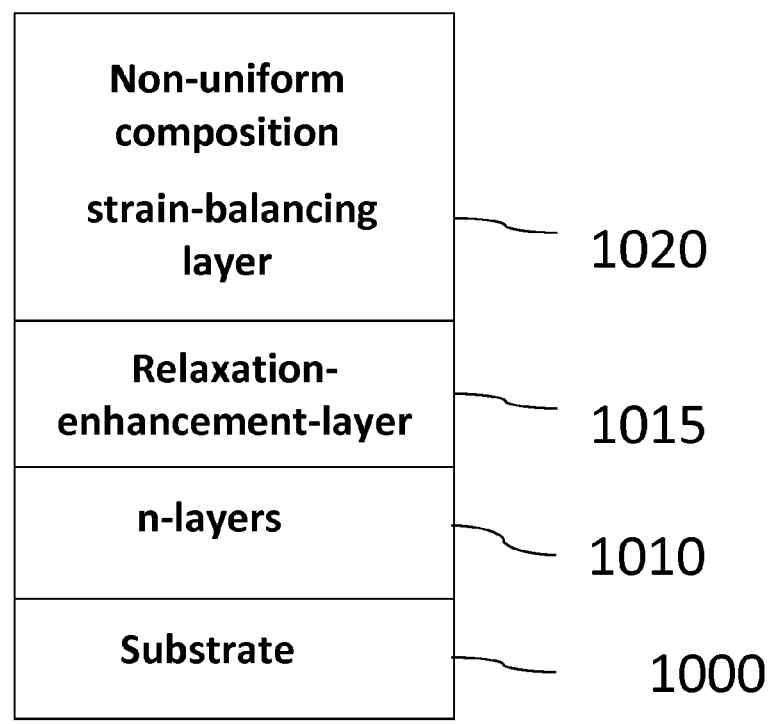
FIG. 10 shows a non-uniform composition strain-balancing layer according to an embodiment of the present invention.

In some embodiments, the strain-balancing layer can consist of multiple layers, with different dopants and doping profiles, and/or with different compositions and composition profiles. Within the strain-balancing layer, the composition can be linearly graded up or down to reach the desired lattice constant and band gap. The composition can also change nonlinearly to meet the desired lattice constant and band gap. This is illustrated in FIG. 10, where strain-balancing layer 1020 has a non-uniform composition profile. Such non-uniform composition strain-balancing layer can be grown by any proper methods known in the art. For example, the growth of strain-balancing layer 1020 can be conducted in a reactor at temperature of 750-850° C. under nitrogen ambient. Metalorganic indium, and/or gallium and/or aluminum sources, $NH_3$, and silane are introduced into the reactor. As the growth progresses, concentration of one or more of these ingredients in the input flow is changed in a controlled manner so as to produce a desired composition profile. In some embodiments, the non-uniform composition strain-balancing layer 1020 is thicker than 0.1 μm to ensure achieving strain-free bulk lattice constant. Preferably, its thickness is in the range of 0.1-1.0 μm, and more preferably in the range of 0.2-0.5 μm.

In some embodiments, non-uniform composition strain-balancing layer 1020 is ternary $In_xGa_{1-x}N$ alloy. Here the indium molar fraction x changes along the thickness of the strain-balancing layer. In some embodiments, non-uniform composition strain-balancing layer 1020 is ternary $Al_yGa_{1-y}N$ alloy. Here the aluminum molar fraction y changes along the thickness of the strain-balancing layer.

When applying formula, $K=t_w(a_{sb}-a_w)/a_w+t_b(a_{sb}-a_b)/a_b$, the lattice constant ($a_{sb}$) of strain-balancing layer 1020 is the average lattice constant of that layer.

Figure 4:
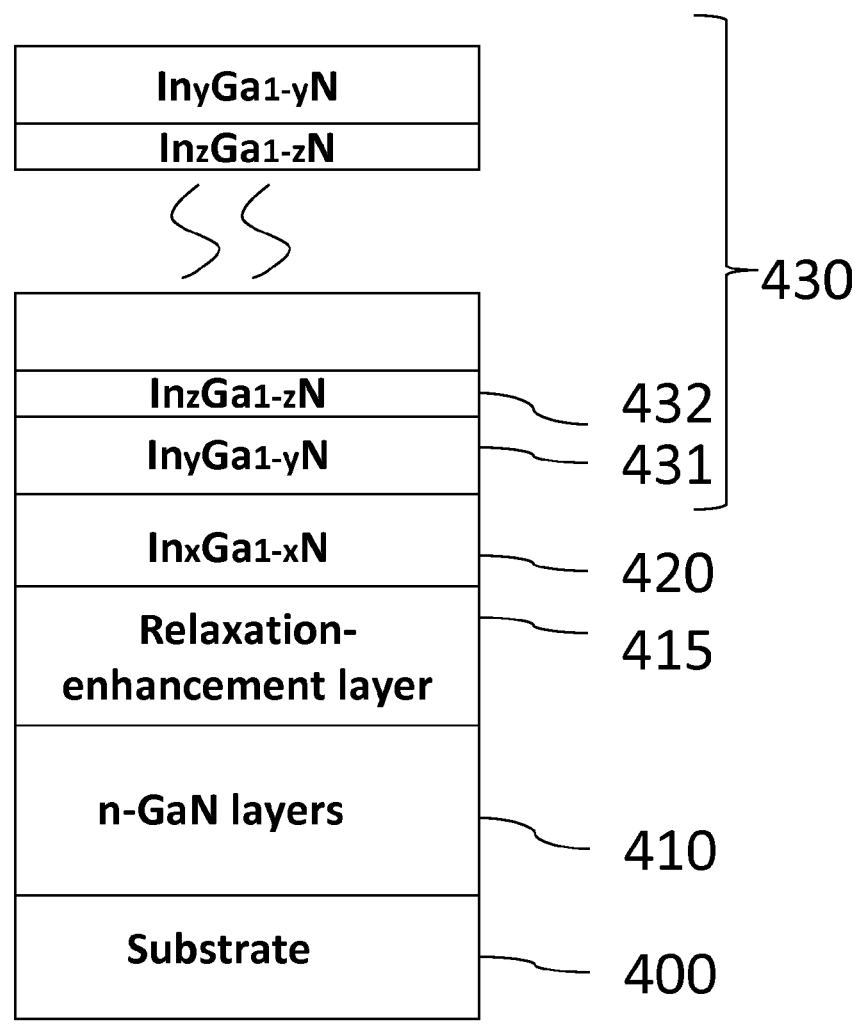
FIG. 4a shows an embodiment of visible light emitting multiple-quantum-well of the present invention.
FIG. 4b shows an embodiment of ultraviolet light emitting multiple-quantum-well of the present invention.
Figure 4:
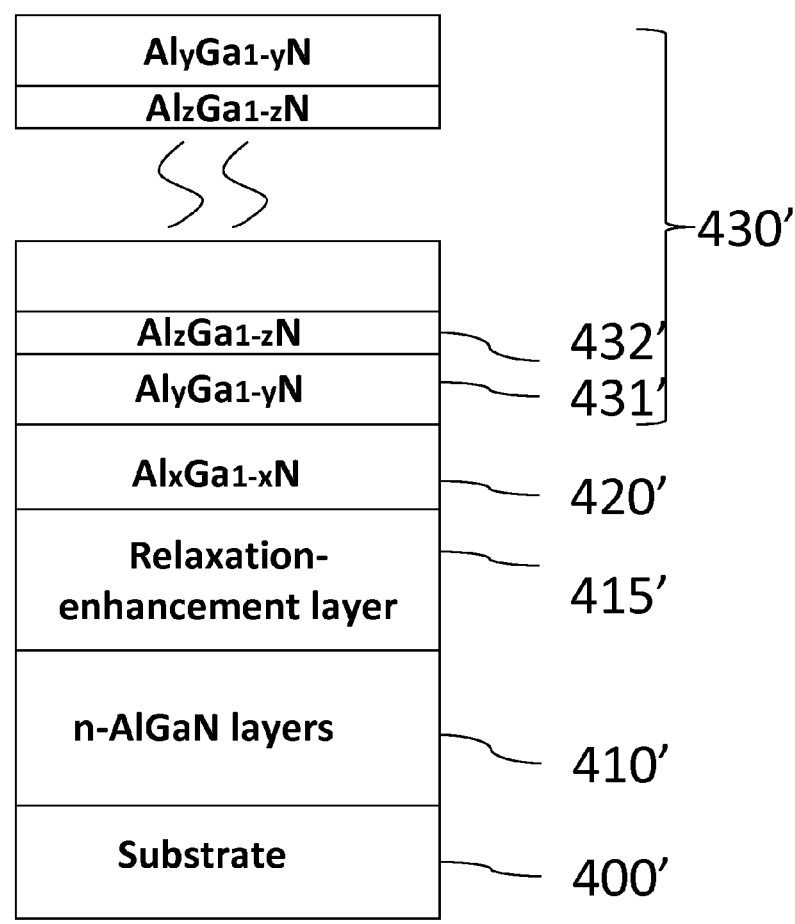

Substrate 1000 and electron injection layer 1010 are similar to those as described in connection with FIGS. 2-4.

Figure 11:
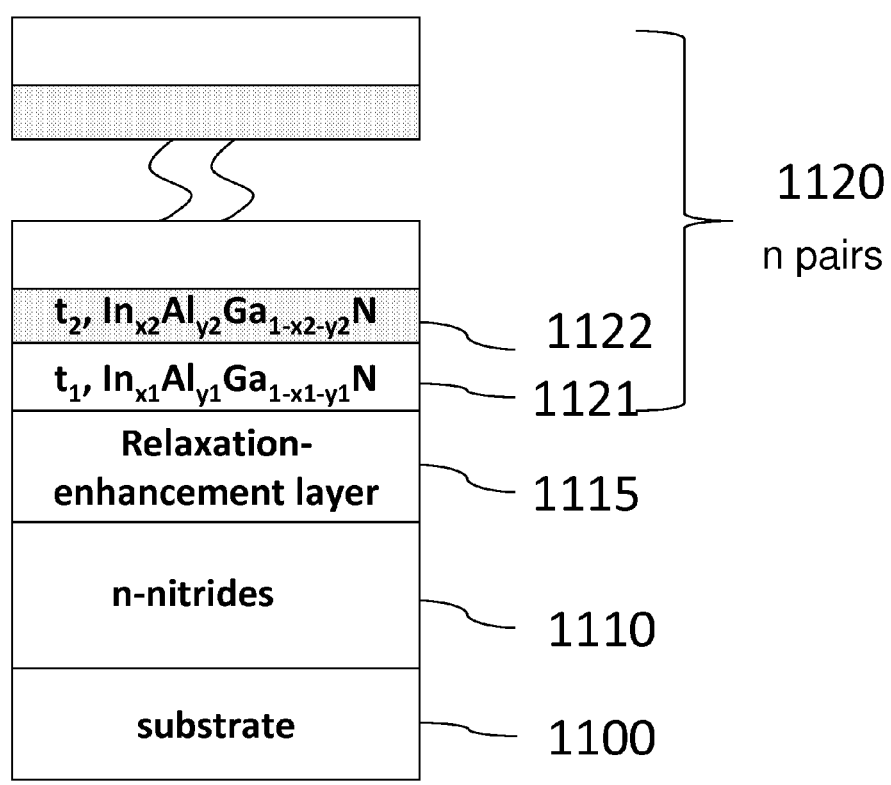
FIG. 11 shows a structure with a strain-balancing layer made by repeating cell of $In_{x1}Al_{y1}Ga_{1-x1-y1}N/In_{x2}Al_{y2}Ga_{1-x2-y2}N$ according to an embodiment of the present invention.

In some embodiments, the strain-balancing layer can be composed of plural layers with repeated composition abrupt changes for many times to achieve the desired lattice constant and band gap. This is shown in an embodiment in FIG. 11. Here, the strain-balancing layer 1120 can be made by repeating cell of $In_{x1}Al_{y1}Ga_{1-x1-y1}N/In_{x2}Al_{y2}Ga_{1-x2-y2}N$ (1121/1122) for many cycles, where $x_1,y_1$ $x_2$, and $y_2$ are in the range of 0 and 1, including 0 and 1, and $(x_1,y_1)$ differs from $(x_2,y_2)$ when they are not equal to zero. And each layer's thickness in the repeating cell can be in the range of 5 Å to 1000 Å, more preferably from 5 Å to 200 Å, more preferably from 5 Å to 50 Å.

Substrate 1100 and electron injection layer 1110 are similar to those as described in connection with FIGS. 2-4.

Figure 12:
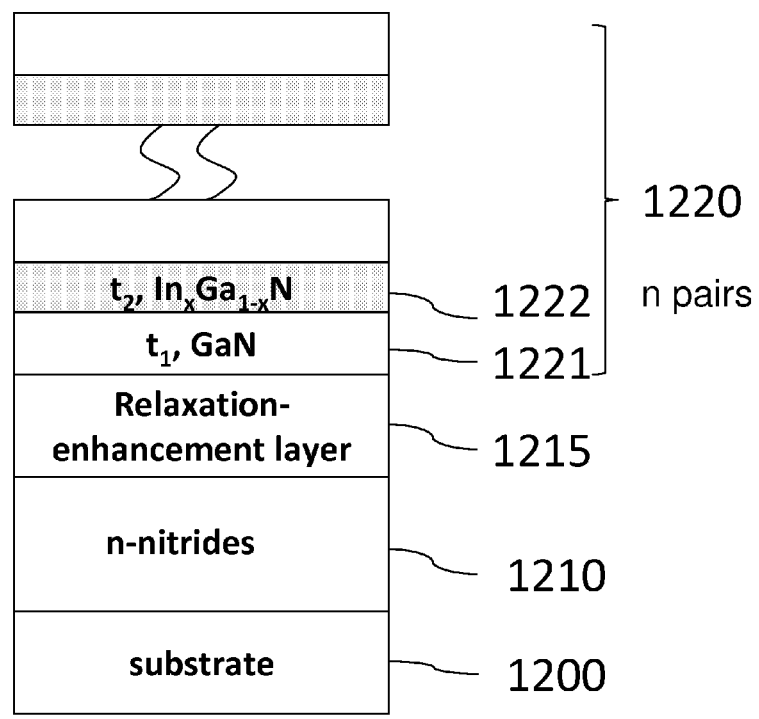
FIG. 12 shows a structure with a strain-balancing layer made by repeating cell of $GaN/In_xGa_{1-x}N$ according to an embodiment of the present invention.

In some embodiments (FIG. 12), the strain-balancing layer 1220 directly or indirectly deposited on electron injection 1210 can be made of short period $GaN/In_xGa_{1-x}N$ superlattice. The superlattice periodicity n, i.e., the repeating number of pairing $GaN/In_xGa_{1-x}N$ is in the range of 10-200, more preferably in the range of 20-100, more preferably in the range of 30-60. The respective thickness of GaN layer (t1) and $In_xGa_{1-x}N$ layer (t2) are in the range of 5-200 Å. The indium-composition x is in the range of 20-100%. The InGaN thickness and composition in the supperlattice are not necessarily to be the same along the growth direction.

In some embodiments, the strain-balancing layer can be doped or co-doped with Si, C, Zn, or/and Mg or other elements to make further adjustment on lattice constants and electrical property and to fine tune the strain balance in the active-region. It can be either conductive or resistive. Doping level of Si and/or Mg can be in the range of $10^{15}$ cm$^{-3}$ to $10^{20}$ cm$^{-3}$, more preferably from $10^{16}$ cm$^3$ to $10^{19}$ cm$^{-3}$.

Spontaneous and strain-resulting piezoelectric polarization fields associated with c-plane InAlGaN layers have been well-known to have a deleterious effect on optoelectronic devices. A review on polarization fields in nitride heterostructures is cited in E. T. Yu, "Spontaneous and piezoelectric polarization in nitride heterostructures", in book "III-V Nitride semiconductors: applications and devices", Edited by E. T. Yu and M. O Manasreh, pp. 161-192, published by Taylor & Francis 2003, which is incorporated herein by reference in its entirety. As a result, it has been patented to use composition-graded active region to reduce the polarization fields within the quantum wells (See U.S. Pat. No. 7,345,324 which is incorporated herein by reference in its entirety), and to use a strain-relaxed confinement layer above the active-region for enhanced electron blocking effect (See U.S. Pat. No. 6,943,381 which is incorporated herein by reference in its entirety), and to use a fully relaxed, low-temperature grown, non-single-crystal InGaN for strain-free quantum-well growth (See U.S. Pat. No. 7,547,908 which is incorporated herein by reference in its entirety). Alternatively, there are publications to use quaternary for polarization field reduction in active-regions grown on top of GaN templates (See Jianping Zhang et al., "Enhanced luminescence in InGaN multiple quantum wells with quaternary AlInGaN barriers", Applied Physics Letters, Vol. 77, No. 17, Oct. 23, 2000, pp. 2668-2670; and Martin Schubert et al., "Polarization-matched $Ga_{1-n}$N/AlGaInN multi-quantum-well light-emitting diodes with reduced efficiency droop", Applied Physics Letters, Vol. 93, No. 4, Jul. 28, 2008, pp. 041102 (1-3), both of which are incorporated herein by reference in its entirely). In the present invention, a strain-balancing interposed layer in-between n-type nitride base layers and active-regions also greatly enhances the flexibility of the polarization field engineering for different application purposes.

In some embodiments, the strain-balancing layer can be used to mitigate polarization fields within the active-regions, where electron-hole wavefunction overlapping is a main concern. The band diagrams and polarization field distributions of two LED structures are compared in FIGS. 13a, 13b and FIGS. 14a, 14b.

Figure 13:
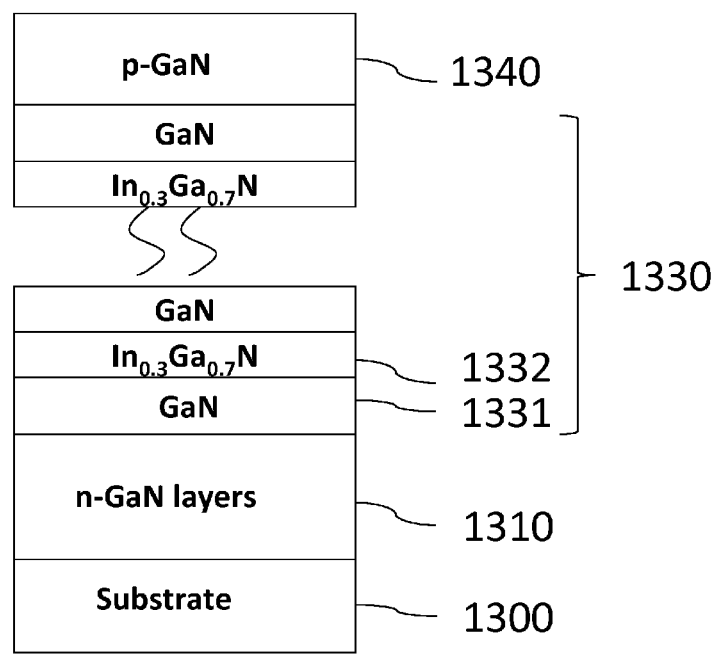

FIG. 13a shows an LED structure, which has a substrate 1300, a n-GaN layer(s) 11310 formed on substrate 1300, an active region 1330 formed on the n-GaN layer(s) 1310, and a p-GaN layer 1340 having a thickness of about 2000 Å formed on the active region 1330. The active region 1330 includes a plurality of $In_{0.3}Ga_{0.7}$N/GaN well/barrier pairs (layers 1332/1331), each GaN barrier layer 1331 has a thickness of about 80 Å and each $In_{0.3}Ga_{0.7}$N well layer 1332 has a thickness of about 30 Å. As seen in FIG. 13b, the polarization field strength in the prior-art quantum wells is about 1.5 MV/cm, resulting in a significant band tilt, which will separate electrons and holes to different potential wells. This will lead to a reduced electron-hole radiative recombination probability, or inferior device internal quantum efficiency. Aside from this, we note that the field in the quantum barrier area, of strength close to 0.8 MV/cm, has an opposite sign. This means it will impede carriers transport, resulting in a high series resistance for the device.

Figure 14:
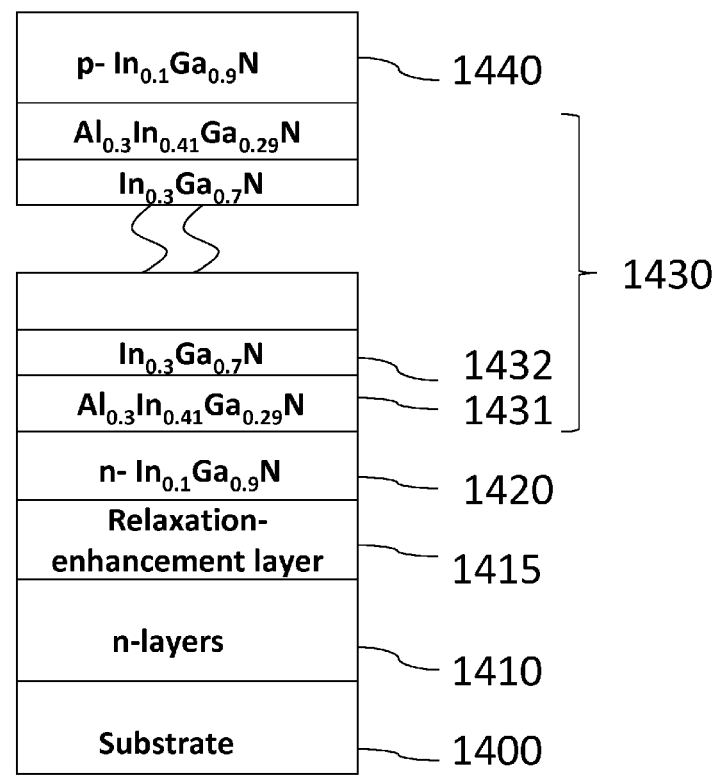
Figure 14:
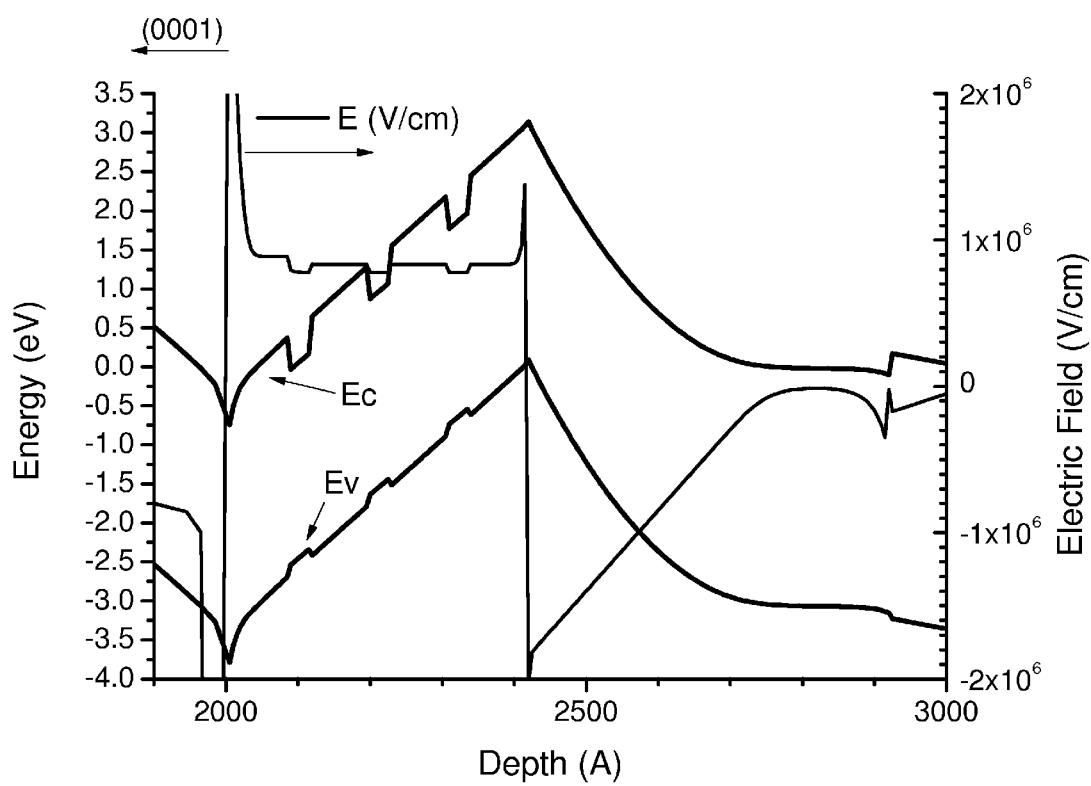

FIG. 14a shows an LED structure according to an embodiment of the present invention, which has a substrate 1400 (similar to that shown in FIG. 10a), a n-GaN layer(s) 1410 formed on substrate 1400 (similar to that shown in FIG. 13a), a strain-balancing $In_{0.1}Ga_{0.9}$N layer 1420 having a thickness of about 500 Å formed on the LT-grown n-GaN layer(s) relaxation-enhancement layer 1415, an active region 1430' formed on strain-balancing layer 1420, and a p-$In_{0.1}Ga_{0.9}$N layer 1440 having a thickness of about 2000 Å formed on the active region 1430'. The active region 1430' includes a plurality of $In_{0.3}Ga_{0.7}$N/$Al_{0.3}In_{0.41}Ga_{0.29}$N well/barrier pairs (layers 1432/1431'), each A0.3In0.41Ga0.29N barrier layer 1431' has a thickness of about 80 Å, and each $In_{0.3}Ga_{0.7}$N well layer 1432 has a thickness of about 30 Å similar to that as shown in FIG. 13a. In FIG. 14b, it is can be seen that, by comparing with the LED structure shown in FIG. 13a, in the LED structure shown in FIG. 14a, the field strength in the quantum wells dramatically reduces to ~0.8 MV/cm. Furthermore, the field direction in the quantum barriers is now changed into favoring carriers transport.

Figure 15:
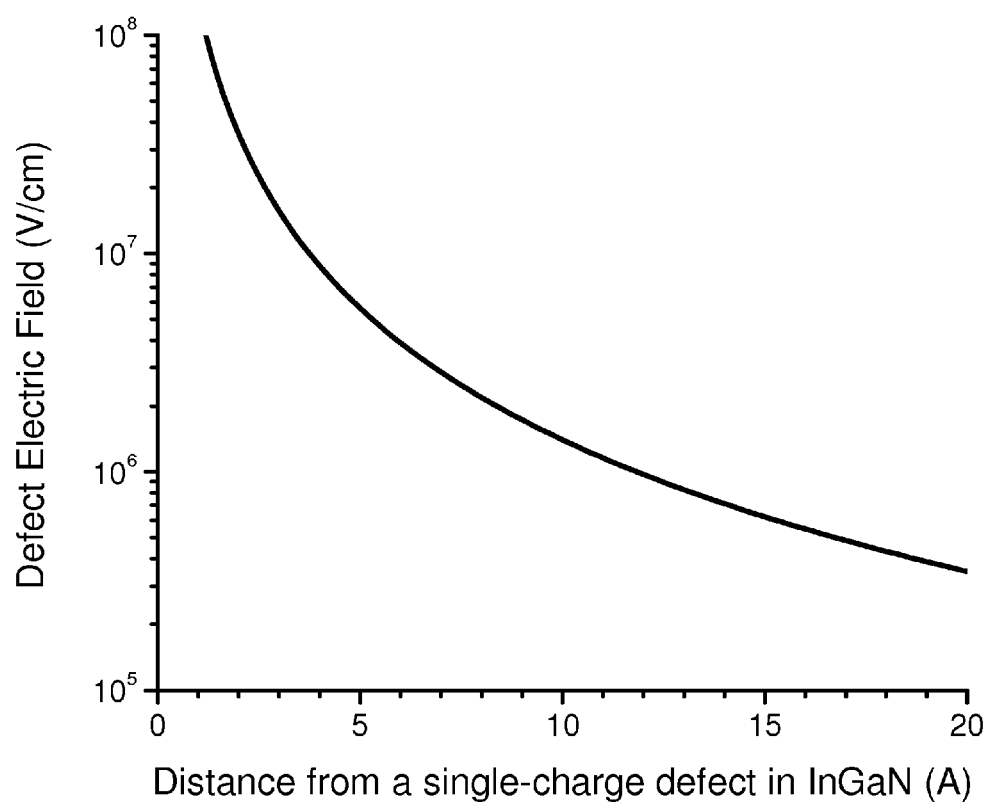
FIG. 15 is the estimated field strength of a single-charge defect in InGaN layers.

In some embodiments, where defects become the dominant efficiency killer over wavefunction overlapping, such as in the case of deep green and deep UV emitting active-regions, it is the present inventors that point out that polarization field can be used to improve internal quantum efficiency to some extent. The principle is like this. Defects capture carriers via Coulomb's force. Any strong enough external electric field can weaken this capture, resulting in a reduced capture cross-sectional area. It has been theoretically found out by J. P. Sorbier et al. that capture cross-sectional radius varies inversely with the square root of the external electric field (See J. P. Sorbier et al., "Bi-dimensional ballistic model of a trap capture cross-section", Journal of Non-crystalline Solids, Vol. 322, No. 1-3, June 2003, pp. 11-16, which is incorporated herein by reference in its entirety). Shown in FIG. 15 is the estimated field strength of a single-charge defect in InGaN layers. As shown, the single-charge defect can generate capturing field around MV/cm depending on the capturing distance. Any external electric field with strength in this range can have a pronounced screening effect on the defect capturing.

Figure 16:
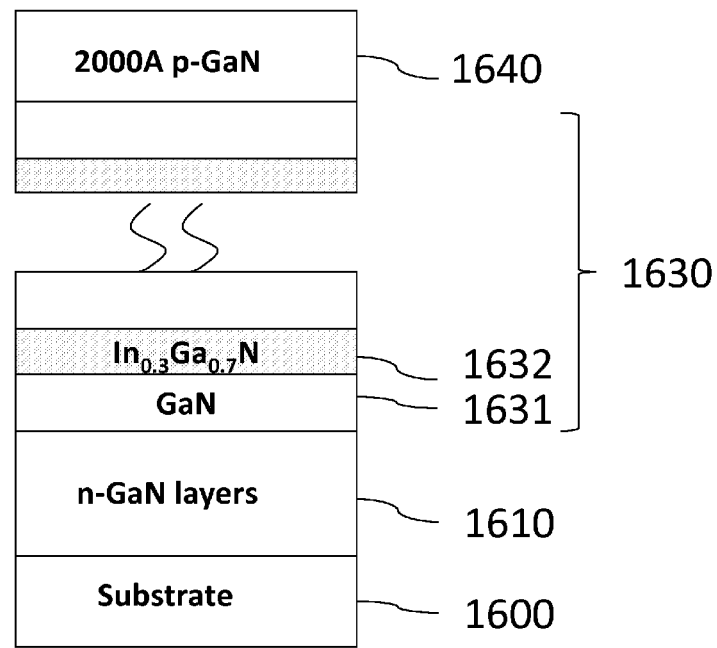
Figure 16:
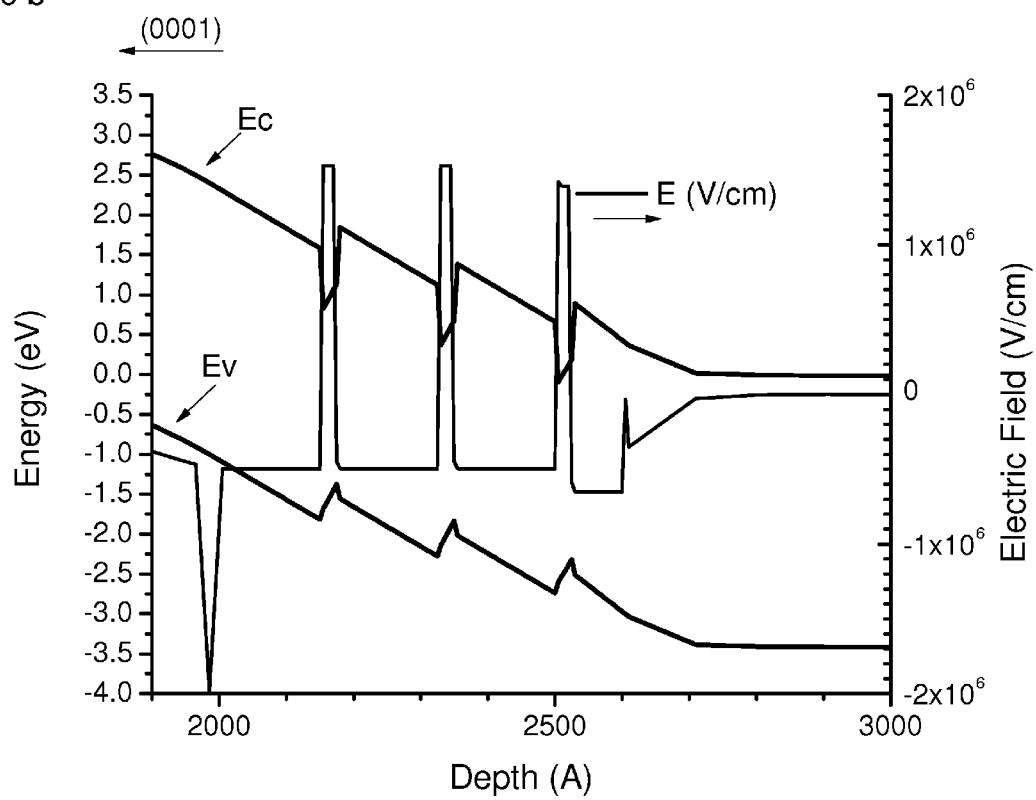

In one embodiment for deep green LEDs, where the defect density in the active-region could be close to $10^{10}$ cm$^{-2}$, which means average distance between defects to be less than 1000 Å, it is highly desirable to have strong electric field to screen these defects. Shown in FIG. 16b is the band diagram and polarization field for a deep green LED structure without a strain-balancing layer as shown in FIG. 16a, where the polarization field within the quantum well is around 1.5 MV/cm. Considering the high defect density in these LEDs, this strong electric field shall already favor IQE by screening defects' capture of injected carriers. This can explain why nitride LEDs are much less sensitive to defects than any other LEDs do, such as AlInGaAs and AlInGaP LEDs. In AlInGaAs and AlInGaP LEDs there is virtually zero polarization-field in the active-region. Thus their active-regions are very sensitive to defects. The LED structure shown in FIG. 16a has a substrate 1600, an n-GaN layer(s) 1610 formed on substrate 1600, an active region 1630 formed on the n-GaN layer(s) 1610, and a p-GaN layer 1640 having a thickness of about 2000 Å formed on the active region 1630. The active region 1630 includes a plurality of $In_{0.3}Ga_{0.7}$N/GaN well/barrier pairs (layers 1632/1631), each GaN barrier layer 1631 has a thickness of about 150 Å and each $In_{0.3}Ga_{0.7}$N well layer 1632 has a thickness of about 15 Å.

Figure 17A:
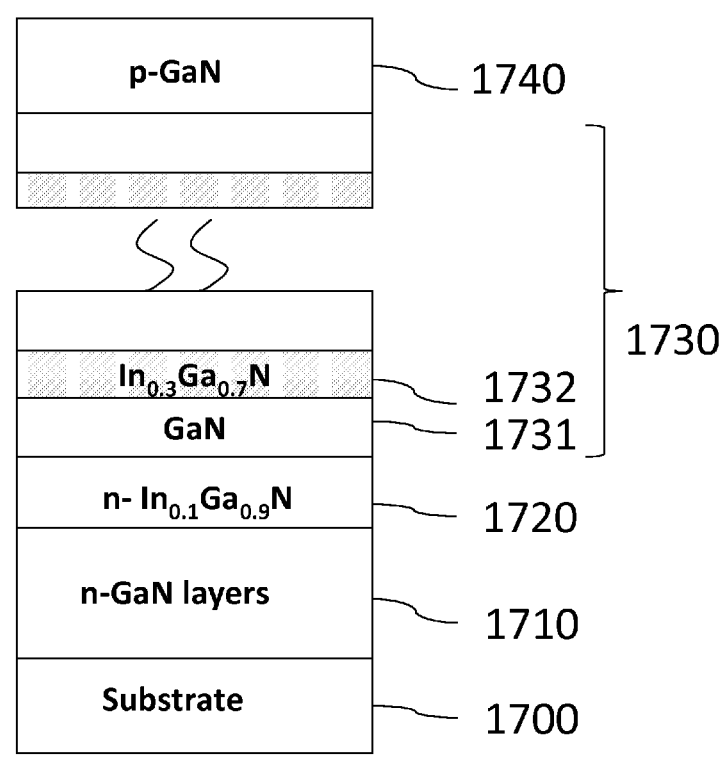
FIG. 17a shows a schematic cross-sectional structure of a multiple-quantum-well deep green LED with a strain-balancing layer according to an embodiment of the present invention.
Figure 17:
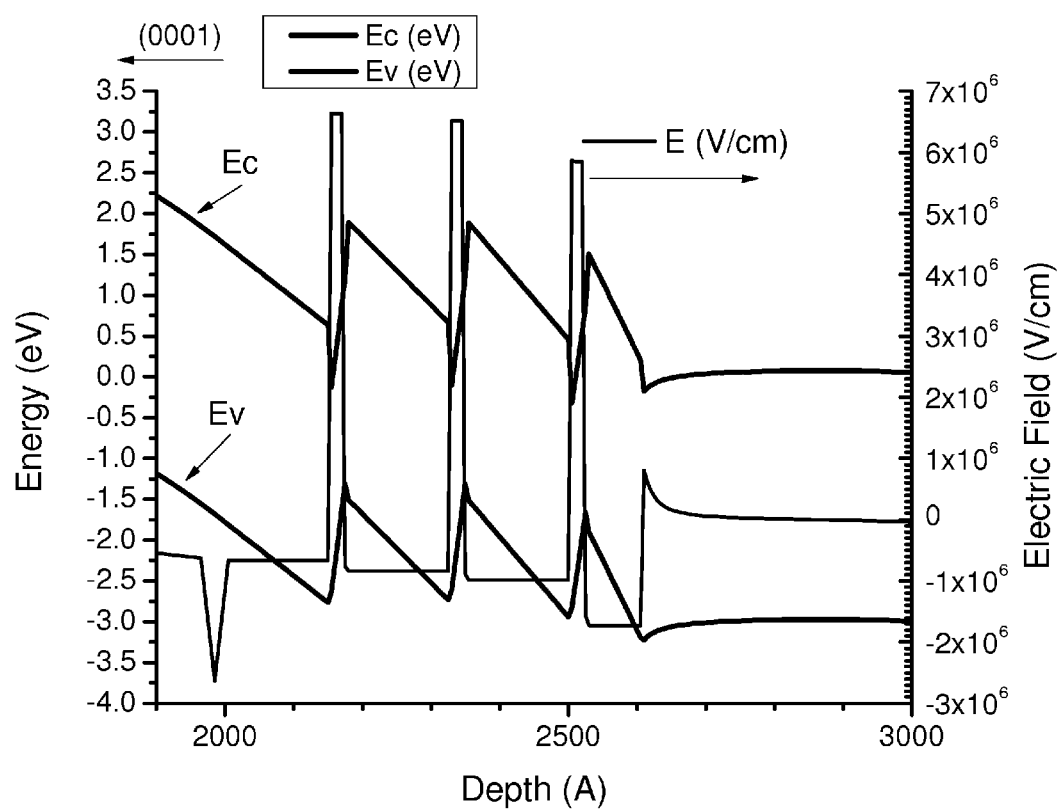

The only difference between the Led structures shown in FIG. 16a and in FIG. 17a is that a strain-balancing $In_{0.1}Ga_{0.9}$N layer 1720 is formed between the n-GaN layer and the active region in the LED structure of FIG. 17a. In the LED structure of FIG. 17a, the substrate 1700, the n-GaN layer(s) 1710, the active region 1730 with the $In_{0.3}Ga_{0.7}$N/GaN well/barrier pairs (layers 1732/1731), and the p-GaN layer 1740 are similar to the corresponding layers of the LED structure shown in FIG. 16a. In FIG. 17b, it shows that, by applying the strain-balancing layer 1720, it can further enhance the electric field within the quantum wells up to 6.5 MV/cm. This will reinforce the defect screening and improve internal quantum efficiency to some extent.

The present invention has been described using exemplary embodiments. However, it is to be understood that the scope of the present invention is not limited to the disclosed embodiments. On the contrary, it is intended to cover various modifications and similar arrangement or equivalents. The scope of the claims, therefore, should be accorded the broadest interpretation so as to encompass all such modifications and similar arrangements and equivalents.

What is being claimed is:

1. A light-emitting semiconductor device comprising:
a substrate;
a strain-balancing layer with a lattice constant, $a_{sb}$, formed over the substrate; and
a III-nitride active region formed over the strain-balancing layer, wherein the III-nitride active region comprises at least one well layer with a lattice constant, $a_w$, and a thickness, $t_w$, and at least one barrier layer with a lattice constant, $a_b$, and a thickness, $t_b$;
wherein the lattice constant of the strain-balancing layer is larger than that of the barrier layer and less than that of the well layer, and satisfies the following equation:

$$|t_w(a_{sb}-a_w)/a_w + t_b(a_{sb}-a_b)/a_b| \leq K$$

where K=1.0 Å.

2. The light-emitting semiconductor device of claim 1, wherein the III-nitride active region comprises 4-100 pairs of well layers and barrier layers, each pair of well layer and barrier layer satisfies the equation: $|t_w(a_{sb}-a_w)/a_w + t_b(a_{sb}-a_b)/a_b| \leq K$.

3. The light-emitting semiconductor device of claim 1, further comprising:
an electron injection layer formed over the substrate; and
a relaxation-enhancement layer for enhancing relaxation of the strain-balancing layer, the relaxation-enhancement layer being formed between the electron injection layer and the strain-balancing layer, wherein the lattice constant of the relaxation-enhancement layer is either larger than that of the strain-balancing layer, or smaller than that of the electron injection layer, and the lattice constant of the strain-balancing layer is larger than that of the electron injection layer.

4. The light-emitting semiconductor device of claim 3, wherein the relaxation-enhancement layer comprises an AlGaN layer and the strain-balancing layer comprises an InGaN layer.

5. The light-emitting semiconductor device of claim 3, wherein the relaxation-enhancement layer comprises an $In_yGa_{1-y}N$ layer and the strain-balancing layer comprises an $In_xGa_{1-x}N$ layer, wherein y>x.

6. The light-emitting semiconductor device of claim 3, wherein the relaxation-enhancement layer is fully relaxed.

7. The light-emitting semiconductor device of claim 1, further comprising:
an electron injection layer formed over the substrate; and
a relaxation-enhancement layer for enhancing relaxation of the strain-balancing layer, the relaxation-enhancement layer being formed between the electron injection layer and the strain-balancing layer, wherein the lattice constant of the relaxation-enhancement layer is either smaller than that of the strain-balancing layer, or larger than that of the electron injection layer, and the lattice constant of the strain-balancing layer is smaller than that of the electron injection layer.

8. The light-emitting semiconductor device of claim 7, wherein the relaxation-enhancement layer comprises an $Al_yGa_{1-y}N$ layer and the strain-balancing layer comprises an $Al_xGa_{1-x}N$ layer, where y>x.

9. The light-emitting semiconductor device of claim 7, wherein the relaxation-enhancement layer is fully relaxed.

10. The light-emitting semiconductor device of claim 1, further comprising a p-layer formed over the III-nitride active region, wherein the p-layer has a lattice constant, $a_p$, and satisfies the following relationship: $|(a_{sb}-a_p)/a_p| \leq 0.02$.

11. The light-emitting semiconductor device of claim 10, wherein the p-layer comprises a Mg-doped $In_pGa_{1-p}N$ layer, where $0.02 \leq p \leq 0.3$.

12. The light-emitting device of claim 1, wherein said III-nitride strain-balancing layer gradually increases lattice constant in the growth direction.

13. The light-emitting device of claim 1, wherein said III-nitride strain-balancing layer gradually decreases lattice constant in the growth direction.

14. The light-emitting semiconductor device of claim 1, wherein said III-nitride strain-balancing layer is of n-type conductivity.

15. The light-emitting semiconductor device of claim 1, wherein said III-nitride strain-balancing layer is of p-type conductivity.

16. The light-emitting device of claim 1, wherein said III-nitride strain-balancing layer comprises plurality of repeating cells, $In_{x1}Al_{y1}Ga_{1-x1-y1}N/In_{x2}Al_{y2}Ga_{1-x2-y2}N$, where $x_1$, $x_2$, $y_1$ and $y_2$ are in the range of 0 and 1, including 0 and 1.

17. The light-emitting device of claim 1, further including a fully-strained layer formed between the strain-balancing layer and the III-nitride active region.

18. The light-emitting device of claim 17, wherein the fully-strained layer comprises an $Al_xGa_{1-x}N$ layer, where $0.05 \leq x \leq 0.4$.

19. A light-emitting semiconductor device comprising:
a substrate;
an electron injection layer formed over the substrate;
a relaxation-enhancement layer formed over the electron injection layer;
a strain-balancing layer formed over the relaxation-enhancement layer; and
a III-nitride active region formed over the strain-balancing layer, wherein the III-nitride active region comprises at least one pair of a well layer and a barrier layer;
wherein the lattice constant of the strain-balancing layer is larger than that of the barrier layer and less than that of the well layer, and the lattice constant of the relaxation-enhancement layer is either larger than that of the strain-balancing layer and that of the electron injection layer, or smaller than that of the strain-balancing layer and that of the electron injection layer.

20. The light-emitting semiconductor device of claim 19, wherein the relaxation-enhancement layer comprises an AlGaN layer and the strain-balancing layer comprises an InGaN layer.

21. The light-emitting semiconductor device of claim 19, wherein the relaxation-enhancement layer comprises an $In_yGa_{1-y}N$ layer and the strain-balancing layer comprises an $In_xGa_{1-x}N$ layer, wherein y>x.

22. The light-emitting semiconductor device of claim 19, wherein the relaxation-enhancement layer comprises an $Al_yGa_{1-y}N$ layer and the strain-balancing layer comprises an $Al_xGa_{1-x}N$ layer, where y>x.

23. The light-emitting semiconductor device of claim 19, wherein the III-nitride active region comprises 4-40 pairs of $In_xGa_{1-x}N$ well layers and $In_yGa_{1-y}N$ barrier layers, where $0.3 \leq x \leq 0.6$, $0 \leq y < x$, and the ratio (R) between the thickness of the barrier layer ($t_b$) and the thickness of the well layer ($t_w$), $R=t_b/t_w$, satisfies $0.3 \leq R \leq 15$.

24. The light-emitting semiconductor device of claim 19, wherein the III-nitride active region comprises 10-80 pairs of $In_xGa_{1-x}N$ well layers and $In_yGa_{1-y}N$ barrier layers, where $0.1 \leq x \leq 0.4$, $0 \leq y < x$, and the ratio (R) between the thickness of the barrier layer ($t_b$) and the thickness of the well layer ($t_w$), $R=t_b/t_w$, satisfies $0.3 \leq R \leq 8$.

25. The light-emitting semiconductor device of claim 19, wherein the III-nitride active region comprises 15-100 pairs of $In_xAl_yGa_{1-x-y}N$ well layers and barrier layers, where $0 \leq x \leq 0.15$, $0 \leq y \leq 0.6$, and the ratio (R) between the thickness of the barrier layer ($t_b$) and the thickness of the well layer ($t_w$), $R=t_b/t_w$, satisfies $0.3 \leq R \leq 6$.

26. The light-emitting device of claim 19, further including a fully-strained layer formed between the strain-balancing layer and the III-nitride active region.

27. The light-emitting device of claim 26, wherein the fully-strained layer comprises an $Al_xGa_{1-x}N$ layer, where $0.05 \leq x \leq 0.4$.

28. The light-emitting semiconductor device of claim 19, wherein the strain-balancing layer contains from 1% to 20% of indium.

29. The light-emitting semiconductor device of claim 19, wherein the strain-balancing layer contains from 21% to 50% of indium.

30. A method for designing a light-emitting semiconductor device, the device having a III-nitride structure which includes:
  a III-nitride strain-balancing layer with a lattice constant, $a_{sb}$; and
  a III-nitride quantum well active region formed over the strain-balancing layer, wherein the III-nitride quantum well active region includes at least one well layer with a lattice constant, $a_w$, and a thickness, $t_w$, and at least one barrier layer with a lattice constant, $a_b$, and a thickness, $t_b$;

the method comprising:
selecting compositions of the III-nitride strain-balancing layer, the well layer, and the barrier layer to satisfy $a_w > a_{sb} > a_b$; and
selecting $t_w$ and $t_b$ to satisfy the following equation:

$$|t_w(a_{sb}-a_w)/a_w + t_b(a_{sb}-a_b)/a_b| \leq K,$$

where K=1.0 Å.

31. The light-emitting device of claim 19, wherein the lattice constant of the strain-balancing layer is smaller than that of the electron injection layer.

32. The light-emitting device of claim 19, wherein the lattice constant of the strain-balancing layer is larger than that of the electron injection layer, and the lattice constant of the relaxation-enhancement layer is smaller than that of the electron injection layer.

* * * * *